US009264279B2

(12) United States Patent
Luo et al.

(10) Patent No.: US 9,264,279 B2
(45) Date of Patent: Feb. 16, 2016

(54) TRANSMITTER, RECEIVER, AND METHOD FOR RECEIVING AND TRANSMITTING A RADIO FREQUENCY SIGNAL

(71) Applicant: HUAWEI TECHNOLOGIES CO., LTD., Shenzhen (CN)

(72) Inventors: Xun Luo, Shenzhen (CN); Jun Ma, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/699,823

(22) Filed: Apr. 29, 2015

(65) Prior Publication Data

US 2015/0249563 A1    Sep. 3, 2015

Related U.S. Application Data

(63) Continuation of application No. PCT/CN2012/083855, filed on Oct. 31, 2012.

(51) Int. Cl.
*H04K 1/02* (2006.01)
*H04L 27/36* (2006.01)
(Continued)

(52) U.S. Cl.
CPC *H04L 27/36* (2013.01); *H04B 1/04* (2013.01); *H04B 1/40* (2013.01); *H04L 27/0002* (2013.01); *H04L 27/38* (2013.01); *H04B 2001/0408* (2013.01)

(58) Field of Classification Search
CPC . H04L 27/34; H04L 27/38; H04L 2025/0342; H04L 27/2601; H04L 27/362; H04L 2025/03414; H04L 2027/0067; H04L 2027/0059; H04L 27/00; H04B 1/04
USPC ......... 375/340, 261, 326, 260, 268, 300, 320, 375/297, 267
See application file for complete search history.

(56) References Cited

U.S. PATENT DOCUMENTS 4,458,356 A * 7/1984 Toy ..................... H04L 27/2273
  375/261
6,255,906 B1   7/2001 Eidson et al.
(Continued)

FOREIGN PATENT DOCUMENTS

CN     101383647     3/2009
CN     101662822     3/2010
(Continued)

OTHER PUBLICATIONS

International Search Report mailed Aug. 1, 2013 in corresponding international application PCT/CN2012/083855.
(Continued)

*Primary Examiner* — Rahel Guarino
(74) *Attorney, Agent, or Firm* — Staas & Halsey LLP

(57) ABSTRACT

The present invention discloses a transmitter, a receiver, and a method for receiving and transmitting a radio frequency signal, and relates to the field of radio communications technologies, which can perform carrier recovery and generation at a front end of a radio frequency circuit, thereby reducing a running cost of a baseband chip. The method includes: generating, by an amplitude discriminator/phase detector according to an intermediate-frequency analog signal, a signal amplitude pulse signal/signal phase pulse signal that is not corrected; generating, by a bit error matrix corrector, an amplitude/phase correction control signal; correcting, by the amplitude discriminator/phase detector, the signal amplitude pulse signal/signal phase pulse signal according to the amplitude/phase correction control signal; and converting, by an amplitude code generator/phase code generator, a corrected pulse signal into a corresponding digital code. The present invention is applicable to receiving/transmitting a radio frequency signal.

17 Claims, 16 Drawing Sheets

(51) Int. Cl.
*H04B 1/40* (2015.01)
*H04B 1/04* (2006.01)
*H04L 27/00* (2006.01)
*H04L 27/38* (2006.01)

(56) References Cited

U.S. PATENT DOCUMENTS

| | | |
|---|---|---|
| 7,257,381 B2 | 8/2007 | Ammar |
| 8,559,579 B2 | 10/2013 | Staszewski et al. |
| 2010/0188148 A1 | 7/2010 | Mehta et al. |

FOREIGN PATENT DOCUMENTS

| | | |
|---|---|---|
| CN | 101848533 | 9/2010 |
| CN | 102035611 | 4/2011 |

OTHER PUBLICATIONS

Extended European Search Report dated Aug. 3, 2015 in corresponding European Patent Application No. 12887608.3.

PCT International Search Report dated Aug. 1, 2013 in corresponding International Patent Application No. PCT/CN2012/083855.

* cited by examiner

TRANSMITTER, RECEIVER, AND METHOD FOR RECEIVING AND TRANSMITTING A RADIO FREQUENCY SIGNAL

CROSS-REFERENCE TO RELATED APPLICATIONS

This application is a continuation of International Application No. PCT/CN2012/083855, filed on Oct. 31, 2012, which is hereby incorporated by reference in its entirety.

TECHNICAL FIELD

The present invention relates to the field of radio communications technologies, and in particular, to a transmitter, a receiver, and a method for receiving and transmitting a radio frequency signal.

BACKGROUND

In an existing communications system, a baseband chip and a radio frequency circuit typically need to work in collaboration, where the radio frequency circuit is generally responsible for transmitting or receiving a radio frequency signal, and the baseband chip is generally responsible for performing a series of processing on the radio frequency signal; for example, on a transmitter, the baseband chip may encode an audio signal into a radio frequency signal to be transmitted, and on a receiver, the baseband chip may decode a received radio frequency signal into an audio signal. Moreover, the baseband chip also has a signal processing function, such as encoding/decoding address information, text information, and picture information.

The baseband chip further has an important function, which is performing, by using a series of complex algorithms, processing such as carrier recovery or carrier generation on a signal that passes through a radio frequency circuit, so as to correct an error of a signal, thereby ensuring accuracy of a radio frequency signal that is transmitted/received by the radio frequency circuit. An example is described as follows:

As shown in FIG. 1a, which is a radio frequency circuit architecture in the prior art, a receiver and a transmitter are integrated together and are connected to a same baseband chip, so that the baseband chip performs processing such as carrier recovery or carrier generation on a signal that passes through the receiver and the transmitter. For example, as shown in FIG. 1b, which is a general processing procedure for performing carrier recovery on a signal by a baseband chip, where the baseband chip obtains a phase error according to an error that is obtained by a phase detector by performing detection, and after performing processing according to corresponding algorithms by using a loop filter and a digital oscillator, outputs an error-corrected phase signal.

Problems of the Prior Art

In order to improve the running efficiency of a receiver/transmitter, the spectral efficiency of a radio frequency circuit needs to be improved; one of main manners for improving the spectral efficiency is to improve a modulation mode. However, after the modulation mode is improved, for example, 64QAM (Quadrature Amplitude Modulation, Quadrature Amplitude Modulation) is improved to 1024QAM, a baseband chip also requires additional components, so as to ensure proper running of functions such as carrier recovery or carrier generation. Moreover, in the prior art, in order to ensure that the baseband chip runs properly in a high modulation mode, the only feasible solution is to integrate more components on the baseband chip; for example, the baseband chip requires $2^6$ gate circuits in a 64QAM scenario, and requires $2^{10}$ gate circuits in a 1024QAM scenario. Further, in a scenario such as 2048QAM or 4096QAM, the number of required gate circuits even increases exponentially, which cannot be implemented by industrial fabrication. In addition, in order to run in the high modulation mode, components that need to be increased on one baseband chip are not only the gate circuits; other components inside the baseband chip also need to increase exponentially, which causes a huge cost; moreover, power consumption of the baseband chip during running is also very high because of the increase in the components.

This causes the baseband chip and the radio frequency circuit to require a very high cost to perform carrier recovery or carrier generation in the high modulation mode in the prior art.

SUMMARY

Embodiments of the present invention provide a transmitter, a receiver, and a method for receiving and transmitting a radio frequency signal, which enable carrier recovery or carrier generation to be performed at a front end of a radio frequency circuit, so that a baseband chip no longer needs to assume functions of carrier recovery or carrier generation, thereby reducing a running cost of the baseband chip.

To achieve the foregoing objectives, the embodiments of the present invention use the following technical solutions:

According to one aspect, an embodiment of the present invention provides a receiver, including:

a receiving antenna, a front-end frequency conversion module, an amplitude discriminator, an amplitude code generator, and a bit error matrix corrector, where the front-end frequency conversion module obtains a radio frequency signal from the receiving antenna; and the front-end frequency conversion module converts the obtained radio frequency signal into an intermediate-frequency analog signal, and then sends the intermediate-frequency analog signal to the amplitude discriminator, where the front-end frequency conversion module includes a low noise amplifier, a down-conversion frequency mixer, and a gain-controlled amplifier;

the amplitude discriminator is connected to the front-end frequency conversion module; and the amplitude discriminator generates a first signal amplitude pulse signal according to the intermediate-frequency analog signal sent by the front-end frequency conversion module, and then sends the first signal amplitude pulse signal to the amplitude code generator;

the amplitude code generator is connected to the amplitude discriminator; and the amplitude code generator converts the first signal amplitude pulse signal into a first signal amplitude digital code, and then sends the first signal amplitude digital code to the bit error matrix corrector;

the bit error matrix corrector is connected to the amplitude discriminator; and the bit error matrix corrector generates an amplitude correction control signal according to the first signal amplitude digital code, and then sends the amplitude correction control signal to the amplitude discriminator;

the amplitude discriminator corrects the first signal amplitude pulse signal according to the amplitude correction control signal, so as to generate a second signal amplitude pulse signal; and the amplitude code generator converts the second signal amplitude pulse signal into a second signal amplitude digital code, so that the receiver uses the second signal amplitude digital code as a signal amplitude digital code after carrier recovery or carrier generation.

Further, the receiver further includes a phase detector and a phase code generator, where the phase detector is connected to the front-end frequency conversion module; and the phase detector generates a first signal phase pulse signal according to the intermediate-frequency analog signal sent by the front-end frequency conversion module, and then sends the first signal phase pulse signal to the phase code generator;

the phase code generator is connected to the phase detector; and the phase code generator converts the first signal phase pulse signal into the first signal phase digital code, and then sends the first signal phase digital code to the bit error matrix corrector;

the bit error matrix corrector is connected to the phase detector; and the bit error matrix corrector generates a phase correction control signal according to the first signal phase digital code, and then sends the phase correction control signal to the phase detector;

the phase detector corrects the first signal phase pulse signal according to the phase correction control signal, so as to generate a second signal phase pulse signal; and the phase code generator converts the second signal phase pulse signal into a second signal phase digital code, so that the receiver uses the second signal phase digital code as a signal phase digital code after carrier recovery or carrier generation.

According to another aspect, an embodiment of the present invention provides a transmitter, including:

a down-conversion frequency mixer, an amplitude discriminator, an amplitude code generator, a bit error matrix corrector, and a local oscillator frequency generator, where the down-conversion frequency mixer is connected to the local oscillator frequency generator, and converts a to-be-sent radio frequency signal that is obtained from the local oscillator frequency generator into an intermediate-frequency analog signal, and then sends the intermediate-frequency analog signal to the amplitude discriminator;

the amplitude discriminator is connected to the down-conversion frequency mixer, and the amplitude discriminator generates a first signal amplitude pulse signal according to the intermediate-frequency analog signal sent by the down-conversion frequency mixer, and then sends the first signal amplitude pulse signal to the amplitude code generator;

the amplitude code generator is connected to the amplitude discriminator; and the amplitude code generator converts the first signal amplitude pulse signal into a first signal amplitude digital code, and then sends the first signal amplitude digital code to the bit error matrix corrector;

the bit error matrix corrector is connected to the amplitude discriminator; and the bit error matrix corrector generates an amplitude correction control signal according to the first signal amplitude digital code, and then sends the amplitude correction control signal to the amplitude discriminator;

the amplitude discriminator corrects the first signal amplitude pulse signal according to the amplitude correction control signal, so as to generate a second signal amplitude pulse signal; and the amplitude code generator converts the second signal amplitude pulse signal into a second signal amplitude digital code, so that the receiver uses the second signal amplitude digital code as a signal amplitude digital code after carrier recovery or carrier generation.

Further, the transmitter further includes a phase detector and a phase code generator, where the phase detector is connected to the down-conversion frequency mixer; and the phase detector generates a first signal phase pulse signal according to the intermediate-frequency analog signal sent by the down-conversion frequency mixer, and then sends the first signal phase pulse signal to the phase code generator;

the phase code generator is connected to the phase detector; and the phase code generator converts the first signal phase pulse signal into the first signal phase digital code, and then sends the first signal phase digital code to the bit error matrix corrector;

the bit error matrix corrector is connected to the phase detector; and the bit error matrix corrector generates a phase correction control signal according to the first signal phase digital code, and then sends the phase correction control signal to the phase detector;

the phase detector corrects the first signal phase pulse signal according to the phase correction control signal, so as to generate a second signal phase pulse signal; and the phase code generator converts the second signal phase pulse signal into a second signal phase digital code, so that the receiver uses the second signal phase digital code as a signal phase digital code after carrier recovery or carrier generation.

According to still another aspect, an embodiment of the present invention provides a method for receiving a radio frequency signal, including:

receiving, by a receiver, a radio frequency signal, and converting an obtained radio frequency signal into an intermediate-frequency analog signal;

generating a first signal amplitude pulse signal according to the intermediate-frequency analog signal;

converting the first signal amplitude pulse signal into a first signal amplitude digital code;

generating an amplitude correction control signal according to the first signal amplitude digital code, and correcting the first signal amplitude pulse signal according to the amplitude correction control signal, so as to generate a second signal amplitude pulse signal; and converting the second signal amplitude pulse signal into a second signal amplitude digital code, and using the second signal amplitude digital code as a signal amplitude digital code after carrier recovery or carrier generation.

Further, the method further includes:

generating a first signal phase pulse signal according to the intermediate-frequency analog signal;

converting the first signal phase pulse signal into a first signal phase digital code;

generating a phase correction control signal according to the first signal phase digital code, and correcting the first signal phase pulse signal according to the phase correction control signal, so as to generate a second signal phase pulse signal; and converting the second signal phase pulse signal into a second signal phase digital code, and using the second signal phase digital code as a signal phase digital code after carrier recovery or carrier generation.

According to still another aspect, an embodiment of the present invention provides a method for transmitting a radio frequency signal, including:

converting, by a transmitter, a to-be-sent radio frequency signal into an intermediate-frequency analog signal;

generating a first signal amplitude pulse signal according to the intermediate-frequency analog signal;

converting the first signal amplitude pulse signal into a first signal amplitude digital code;

generating an amplitude correction control signal according to the first signal amplitude digital code, and correcting the first signal amplitude pulse signal according to the amplitude correction control signal, so as to generate a second signal amplitude pulse signal; and converting the second signal amplitude pulse signal into a second signal amplitude digital code, so that the transmitter uses the second signal amplitude digital code as a signal amplitude digital code after carrier recovery or carrier generation.

Further, the method further includes:

generating a first signal phase pulse signal according to the intermediate-frequency analog signal;

converting the first signal phase pulse signal into a first signal phase digital code;

generating a phase correction control signal according to the first signal phase digital code, and correcting the first signal phase pulse signal according to the phase correction control signal, so as to generate a second signal phase pulse signal; and converting the second signal phase pulse signal into a second signal phase digital code, so that the transmitter uses the second signal phase digital code as a signal phase digital code after carrier recovery or carrier generation.

In the transmitter, the receiver, and the method for receiving and transmitting a radio frequency signal provided by the embodiments of the present invention, a function of carrier recovery or carrier generation can be implemented on a radio frequency circuit portion of the receiver; compared with the prior art, a baseband chip no longer needs to perform carrier recovery or carrier generation, especially, does not need to assume functions such as frequency deviation suppression and phase noise suppression related to the carrier recovery and consume computing resources, thereby simplifying functions of the baseband chip, reducing power consumption of the baseband chip; moreover, because the baseband chip no longer needs to assume functions requiring execution of complex computing procedures, such as carrier recovery or carrier generation, technique complexity and design difficulty for fabricating the baseband chip are reduced, which directly reduces a cost for fabricating the baseband chip, thereby further reducing a running/use cost of the baseband chip.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1A:
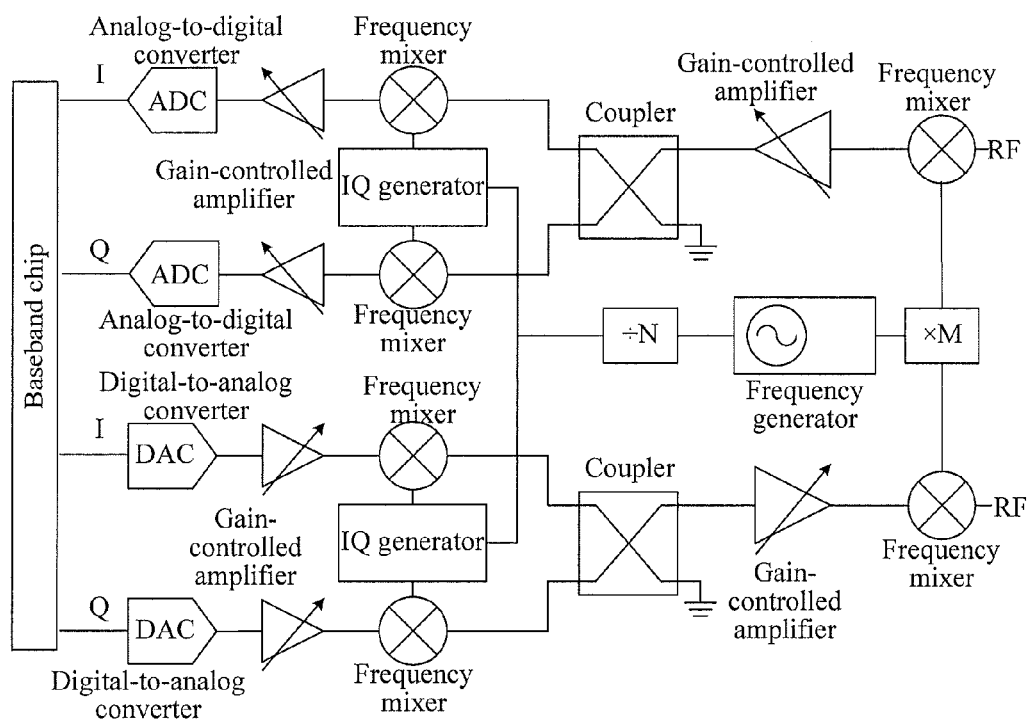
FIG. 1a is a schematic structural diagram of a transceiver in the prior art.
Figure 1B:
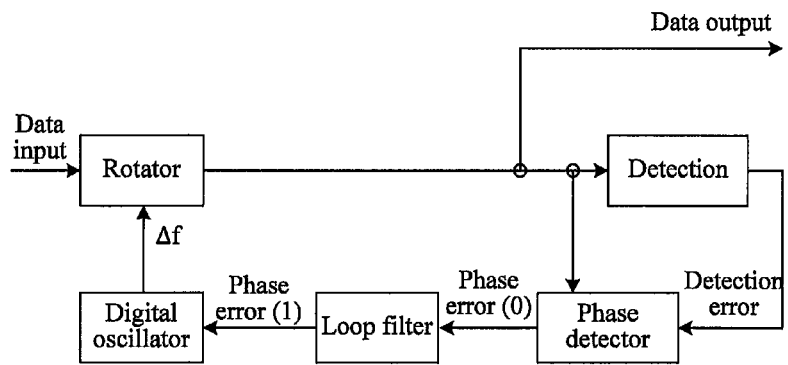
FIG. 1b is a schematic diagram of a workflow of a baseband chip in the prior art.

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

To make the advantages of the technical solutions of the present invention clearer, the following describes the present invention in detail with reference to the accompanying drawings and embodiments.

Embodiment 1

A receiver according to this embodiment includes a receiving antenna, a front-end frequency conversion module, an amplitude discriminator, an amplitude code generator, a bit error matrix corrector, a power splitter, an up-conversion frequency mixer, a local oscillator frequency generator, and a frequency generator phase code generator.

The front-end frequency conversion module is configured to obtain a radio frequency signal from the receiving antenna, convert the obtained radio frequency signal into an intermediate-frequency analog signal, and then send the intermediate-frequency analog signal to the amplitude discriminator, where the front-end frequency conversion module includes a low noise amplifier, a down-conversion frequency mixer, and a gain-controlled amplifier.

The amplitude discriminator is connected to the front-end frequency conversion module, and is configured to generate a first signal amplitude pulse signal according to the intermediate-frequency analog signal sent by the front-end frequency conversion module, and then send the first signal amplitude pulse signal to the amplitude code generator.

The amplitude code generator is connected to the amplitude discriminator, and is configured to convert the first signal amplitude pulse signal as a pulse signal into a first signal amplitude digital code as a digital signal, and then send the first signal amplitude digital code to the bit error matrix corrector, where the amplitude code generator is an encoder configured to convert a pulse signal into a digital signal.

The bit error matrix corrector is connected to the amplitude discriminator and the amplitude code generator, and is configured to generate an amplitude correction control signal according to the first signal amplitude digital code, and then send the amplitude correction control signal to the amplitude discriminator.

The amplitude discriminator is configured to correct the first signal amplitude pulse signal according to the amplitude correction control signal, so as to generate a second signal amplitude pulse signal.

The amplitude code generator is further configured to convert the second signal amplitude pulse signal into a second signal amplitude digital code, so that the receiver uses the second signal amplitude digital code as a signal amplitude digital code after carrier recovery or carrier generation.

Further, a phase detector is connected to the front-end frequency conversion module, and is configured to generate a first signal phase pulse signal according to the intermediate-frequency analog signal sent by the front-end frequency conversion module, and then send the first signal phase pulse signal to a phase code generator.

The phase code generator is connected to the phase detector, and is configured to convert the first signal phase pulse signal as a pulse signal into a first signal phase digital code as a digital signal, and then send the first signal phase digital code to the bit error matrix corrector, where the phase code generator is an encoder configured to convert a pulse signal into a digital signal.

The bit error matrix corrector is connected to the phase detector and the phase code generator, and is configured to generate a phase correction control signal according to the first signal phase digital code, and then send the phase correction control signal to the phase detector.

The phase detector is configured to correct the first signal phase pulse signal according to the phase correction control signal, so as to generate a second signal phase pulse signal.

The phase code generator is further configured to convert the second signal phase pulse signal into a second signal phase digital code, so that the receiver uses the second signal phase digital code as a signal phase digital code after carrier recovery or carrier generation.

The power splitter is connected to the front-end frequency conversion module, the amplitude discriminator, and the phase detector, and is configured to receive the intermediate-frequency analog signal sent by the front-end frequency conversion module, split the intermediate-frequency analog signal into two identical intermediate-frequency analog signals, and then send the two identical intermediate-frequency analog signals respectively to the amplitude discriminator and the phase detector, so that the amplitude discriminator generates the first signal amplitude pulse signal according to one of the intermediate-frequency analog signals sent by the power splitter, and the phase detector generates the first signal phase pulse signal according to the other one of the intermediate-frequency analog signals sent by the power splitter.

The up-conversion frequency mixer is connected to the front-end frequency conversion module, and is configured to perform up-conversion on the intermediate-frequency analog signal sent by the front-end frequency conversion module, so as to generate another radio frequency signal.

The frequency generator phase detector is connected to the local oscillator frequency generator and the up-conversion frequency mixer, and is configured to determine a phase error and obtain a phase error analog signal of the local oscillator frequency generator according to the radio frequency signal generated by the up-conversion frequency mixer and a radio frequency signal output by the local oscillator frequency generator.

The frequency generator phase code generator is connected to the frequency generator phase detector, and is configured to receive the phase error analog signal of the local oscillator frequency generator, and convert the phase error analog signal of the local oscillator frequency generator into a phase error digital code of the local oscillator frequency generator.

The bit error matrix corrector is connected to the frequency generator phase code generator, and is configured to receive the phase error digital code of the local oscillator frequency generator, and generate a correction control signal according to the phase error digital code of the local oscillator frequency generator.

The local oscillator frequency generator is connected to the bit error matrix corrector, and is configured to receive the correction control signal sent by the bit error matrix corrector, and correct a local oscillator signal phase digital code according to the correction control signal.

The up-conversion frequency mixer is connected to the gain-controlled amplifier in the front-end frequency conversion module, and the down-conversion frequency mixer in the front-end frequency conversion module is connected to the frequency generator phase detector.

Figure 2A:
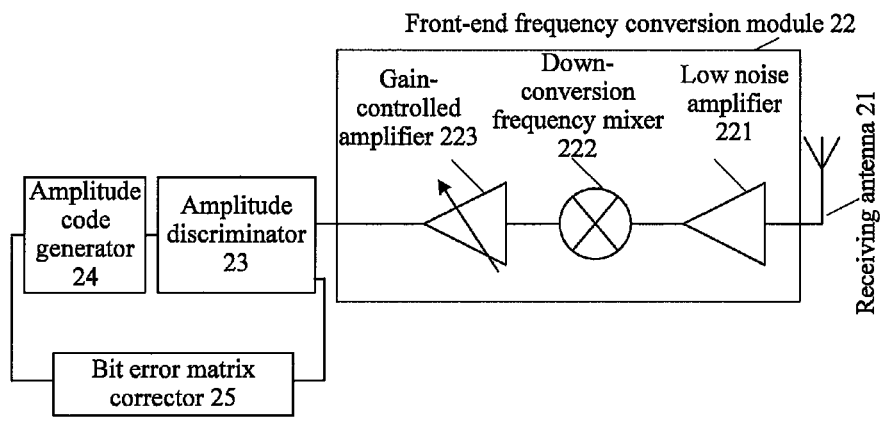
FIG. 2a is a schematic structural diagram of a receiver according to Embodiment 1 of the present invention.

Specifically, in this embodiment, as shown in FIG. 2a, a receiver may include a receiving antenna 21, a front-end frequency conversion module 22, an amplitude discriminator 23, an amplitude code generator 24, and a bit error matrix corrector 25. The front-end frequency conversion module 22 obtains a radio frequency signal from the receiving antenna 21; and the front-end frequency conversion module 22 converts the obtained radio frequency signal into an intermediate-frequency analog signal, and then sends the intermediate-frequency analog signal to the amplitude discriminator 23.

The front-end frequency conversion module 22 includes a low noise amplifier 221, a down-conversion frequency mixer 222, and a gain-controlled amplifier 223.

The amplitude discriminator 23 is connected to the front-end frequency conversion module 22; and the amplitude discriminator 23 generates a first signal amplitude pulse signal according to the intermediate-frequency analog signal sent by the front-end frequency conversion module 22, and then sends the first signal amplitude pulse signal to the amplitude code generator 24.

The amplitude code generator 24 is connected to the amplitude discriminator 23; and the amplitude code generator 24 converts the first signal amplitude pulse signal into a first signal amplitude digital code, and then sends the first signal amplitude digital code to the bit error matrix corrector 25.

The bit error matrix corrector 25 is connected to the amplitude discriminator 23; the bit error matrix corrector 25 generates an amplitude correction control signal according to the first signal amplitude digital code, and then sends the amplitude correction control signal to the amplitude discriminator 23.

The amplitude discriminator 23 corrects the first signal amplitude pulse signal according to the amplitude correction control signal, so as to generate a second signal amplitude pulse signal.

The amplitude code generator 24 converts the second signal amplitude pulse signal into a second signal amplitude digital code, so that the receiver uses the second signal amplitude digital code as a signal amplitude digital code after carrier recovery or carrier generation.

In this embodiment of the present invention, the bit error matrix corrector may perform bit error correction on an error of a digital code generated in a transmitter/the receiver. The error of the digital code in the receiver is mainly caused by reasons including: in a hardware link of a transmitter that performs data communication with the receiver, a deviation is caused for a certain probability during transmission of an electrical signal, so that an error is caused on a digital code that is generated by the receiver according to a received signal; an error is caused in a spatial transmission process of radio communications; and in a hardware link of the receiver, a deviation is caused for a certain probability during transmission of an electrical signal, so that an error is caused on a digital code in the receiver. Moreover, the error of the digital code in the transmitter is mainly caused by reasons including: in a hardware link of the transmitter, a deviation is caused for a certain probability during transmission of an electrical signal, so that an error is caused on a digital code in the transmitter.

It should be noted that bit error matrix correctors in the receiver and the transmitter may be the same. An example is described as follows:

A standard code source, for example, a standard QAM code source in a protocol, that has been formulated in a communications protocol, such as standard signal amplitude digital bit error matrix, signal phase digital bit error matrix, and frequency generator phase digital bit error matrix, may be prestored in the bit error matrix corrector. A skilled person may prestore the code source in the bit error matrix corrector, so that the bit error matrix corrector compares the standard data with the signal amplitude digital code, the signal phase digital code, and the frequency generator phase digital code that are received by the receiver or generated by the transmitter, and outputs a signal amplitude digital bit error, a signal phase digital bit error, and a frequency generator phase digital bit error.

The signal amplitude digital bit error, the signal phase digital bit error, and the frequency generator phase digital bit error may be in a plurality of forms; for example, segment-A characters in a prestored standard signal amplitude digital code is 1010, and segment-A characters in a signal amplitude digital code parsed by the receiver according to a received radio frequency signal is 1011, accordingly, the bit error matrix corrector may obtain a signal amplitude digital bit error by performing simple binary addition or subtraction, that is, 1011−1010=1.

Further, there may be a plurality of processes in which the bit error matrix corrector analyzes a signal amplitude digital code, a signal phase digital code, and a phase error digital code of the local oscillator frequency generator, and obtains a corresponding correction control signal; exemplary solutions are described in the following by using an example.

Figure 2B:
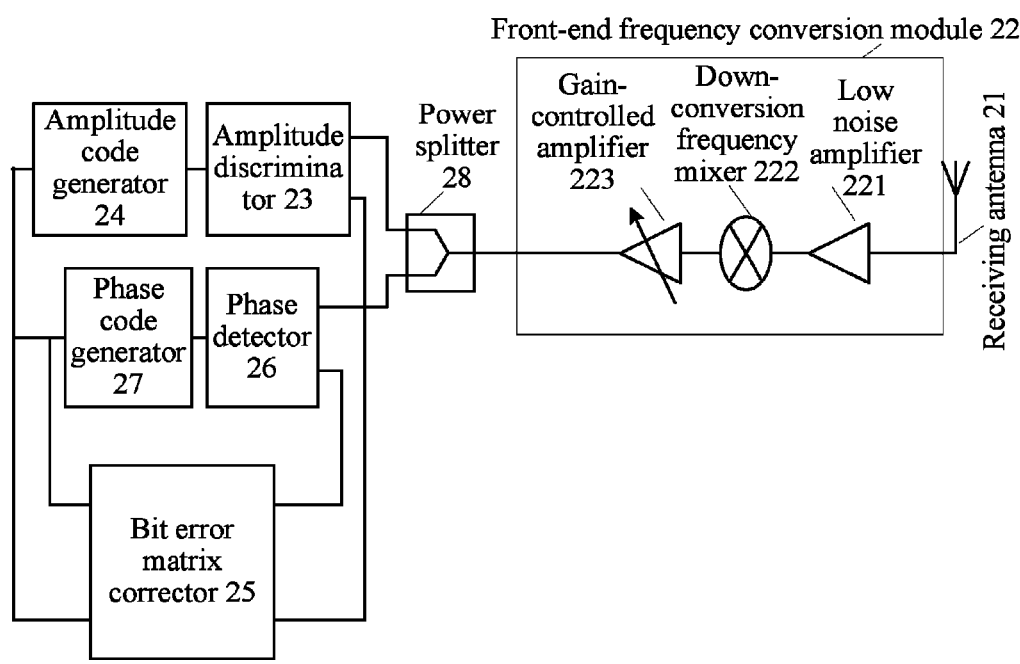
FIG. 2b is another schematic structural diagram of a receiver according to Embodiment 1 of the present invention.
Figure 2C:
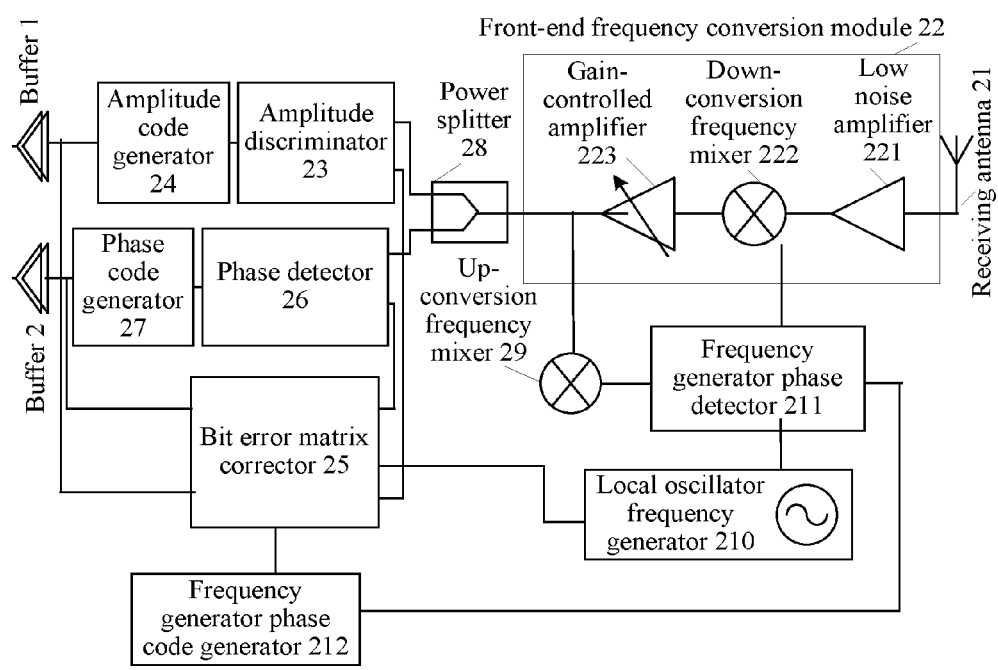
FIG. 2c is still another schematic structural diagram of a receiver according to Embodiment 1 of the present invention.
Figure 2D:
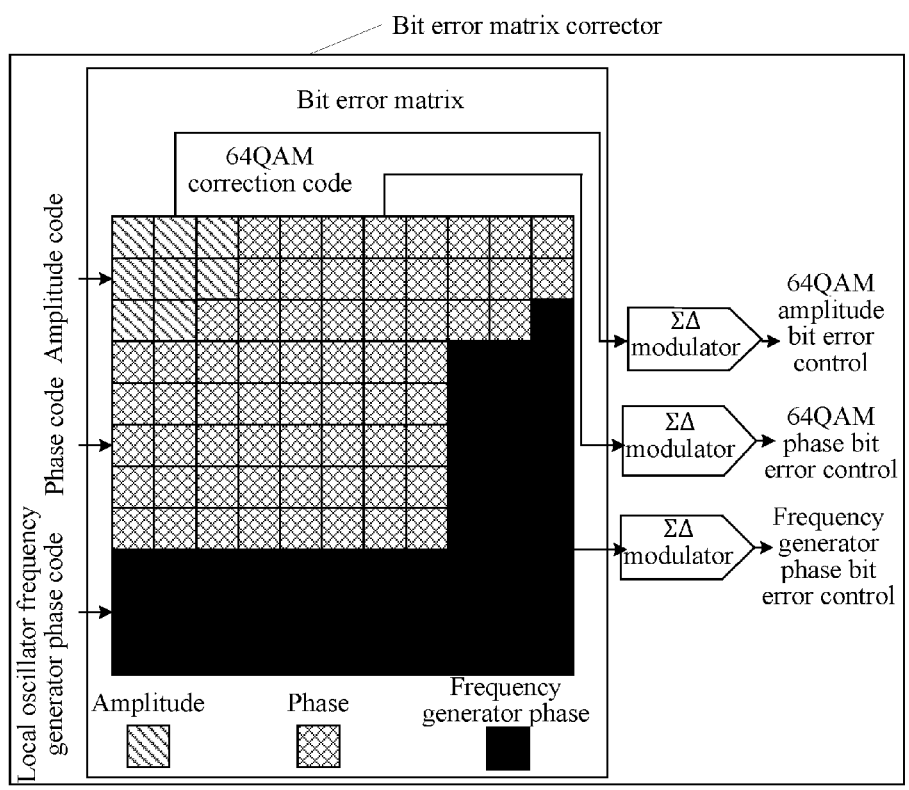
FIG. 2d is a schematic diagram of a specific example according to Embodiment 1 of the present invention.

FIG. 2d shows a process in which a bit error matrix corrector in a radio frequency circuit of a receiver or a transmitter analyzes a signal amplitude digital code, a signal phase digital code, and a phase error digital code of the local oscillator frequency generator in a 64QAM scenario. Squares marked with slashes indicate standard code sources corresponding to the signal amplitude digital code, squares marked with grids indicate standard code sources corresponding to the signal phase digital code, and squares fully marked in black indicate standard code sources corresponding to the phase error digital code of the local oscillator frequency generator; these standard code sources may be standard QAM code sources prestored in the bit error matrix corrector, and these standard QAM code sources have been disclosed in existing protocols, so that a skilled person may learn these standard QAM code sources from the protocols directly.

When the signal amplitude digital code in a radio frequency circuit is transferred to the bit error matrix corrector, the bit error matrix corrector may, by using an existing technical means, for example, by using a comparator, compare the signal amplitude digital code in the radio frequency circuit with a signal amplitude digital code in the standard QAM code source; that is, the bit error matrix corrector may compare the signal amplitude digital code in the radio frequency circuit with data corresponding to the squares marked with slashes shown in FIG. 2d; obtain a difference between them by performing simple binary addition or subtraction; and then output a corresponding signal amplitude correction control analog signal according to the obtained difference by using a EA modulator.

After the signal amplitude correction control analog signal output by the bit error matrix corrector is transferred to the amplitude discriminator, the amplitude discriminator may correct a signal amplitude digital code according to the signal amplitude correction control analog signal. Moreover, the foregoing bit error process may be repeated for a plurality of times, so as to ensure that the signal amplitude digital code is correct.

Similarly, the bit error matrix corrector may process the signal phase digital code and the phase error digital code of the local oscillator frequency generator by using the foregoing process. That is, in this embodiment of the present invention, the bit error matrix corrector may correct a signal amplitude digital code, a signal phase digital code, and a phase error digital code of the local oscillator frequency generator in a receiver, a transmitter, or a transceiver (for example, the radio frequency circuit that integrates receiving and transmitting functions shown in FIG. 6b, FIG. 6c, or FIG. 6d) by using the foregoing process.

It should be further noted that in this embodiment, the foregoing bit error correction process may be applicable to all scenarios of 1024QAM, 2048QAM, 4096QAM, and the like, so as to implement carrier recovery or carrier generation in the scenarios of 1024QAM, 2048QAM, 4096QAM, and the like; and a structure of a radio frequency circuit does not change, and may be fabricated by using existing industrial production devices.

Further, the receiver according to this embodiment may, as shown in FIG. 2b, further include a phase detector 26, a phase code generator 27, and a power splitter 28.

The phase detector 26 is connected to the front-end frequency conversion module 22, and is configured to generate a first signal phase pulse signal according to the intermediate-frequency analog signal sent by the front-end frequency conversion module 22, and then send the first signal phase pulse signal to the phase code generator 27.

The phase code generator 27 is connected to the phase detector 26, and is configured to convert the first signal phase pulse signal as a pulse signal into a first signal phase digital code as a digital signal, and then send the first signal phase digital code to the bit error matrix corrector 25, where the phase code generator 27 is an encoder configured to convert a pulse signal into a digital signal.

The bit error matrix corrector 25 is connected to the phase detector 26 and the phase code generator 27, and is configured to generate a phase correction control signal according to the first signal phase digital code, and then send the phase correction control signal to the phase detector 26.

The phase detector 26 is configured to correct the first signal phase pulse signal according to the phase correction control signal, so as to generate a second signal phase pulse signal.

The phase code generator 27 is further configured to convert the second signal phase pulse signal into a second signal phase digital code, so that the receiver uses the second signal phase digital code as a signal phase digital code after carrier recovery or carrier generation.

The power splitter 28 is connected to the front-end frequency conversion module 22, the amplitude discriminator 23, and the phase detector 26, and is configured to receive the intermediate-frequency analog signal sent by the front-end frequency conversion module 22, split the intermediate-frequency analog signal into two identical intermediate-frequency analog signals, and then send the two identical intermediate-frequency analog signals respectively to the amplitude discriminator 23 and the phase detector 26, so that the amplitude discriminator 23 generates the first signal amplitude pulse signal according to one of the intermediate-frequency analog signals sent by the power splitter 28, and the phase detector 26 generates the first signal phase pulse signal according to the other one of the intermediate-frequency analog signals sent by the power splitter 28.

Specifically, in this embodiment, the phase detector 26 is connected to the front-end frequency conversion module 22; and the phase detector 26 generates the first signal phase pulse signal according to the intermediate-frequency analog signal sent by the front-end frequency conversion module 22, and then sends the first signal phase pulse signal to the phase code generator 27.

The phase code generator 27 is connected to the phase detector 26; and the phase code generator 27 converts the first signal phase pulse signal into the first signal phase digital code, and then sends the first signal phase digital code to the bit error matrix corrector 25.

The bit error matrix corrector 25 is connected to the phase detector 26; and the bit error matrix corrector 25 generates the phase correction control signal according to the first signal phase digital code, and then sends the phase correction control signal to the phase detector 26.

The phase detector 26 corrects the first signal phase pulse signal according to the phase correction control signal, so as to generate a second signal phase pulse signal.

The phase code generator 27 converts the second signal phase pulse signal into a second signal phase digital code, so that the receiver uses the second signal phase digital code as a signal phase digital code after carrier recovery or carrier generation.

The power splitter 28 is connected to the front-end frequency conversion module 22, the amplitude discriminator 23, and the phase detector 26; and the power splitter 28 receives the intermediate-frequency analog signal sent by the front-end frequency conversion module 22, splits the intermediate-frequency analog signal into two identical intermediate-frequency analog signals, and then sends the two identical intermediate-frequency analog signals respectively to the amplitude discriminator 23 and the phase detector 26, so that the amplitude discriminator 23 generates the first signal amplitude pulse signal according to one of the intermediate-frequency analog signals, and the phase detector 26 generates the first signal phase pulse signal according to the other one of the intermediate-frequency analog signals.

Still further, the receiver according to this embodiment may, as shown in FIG. 2c, further include an up-conversion frequency mixer 29, a local oscillator frequency generator 210, a frequency generator phase detector 211, and a frequency generator phase code generator 212.

The up-conversion frequency mixer 29 is connected to the front-end frequency conversion module 22; and the up-conversion frequency mixer 29 performs up-conversion on the intermediate-frequency analog signal sent by the front-end frequency conversion module 22, so as to generate another radio frequency signal.

The frequency generator phase detector 211 is connected to the local oscillator frequency generator 210 and the up-conversion frequency mixer 29; and the frequency generator phase detector 211 determines a phase error and obtains a phase error analog signal of the local oscillator frequency generator 210 according to the radio frequency signal generated by the up-conversion frequency mixer 29 and a radio frequency signal output by the local oscillator frequency generator 210.

The frequency generator phase code generator 212 is connected to the frequency generator phase detector 211; and the frequency generator phase code generator 212 receives the phase error analog signal of the local oscillator frequency generator 210, and converts the phase error analog signal of the local oscillator frequency generator 210 into a phase error digital code of the local oscillator frequency generator.

The bit error matrix corrector 25 is connected to the frequency generator phase code generator 212; and the bit error matrix corrector 25 receives the phase error digital code of the local oscillator frequency generator, and generates a correction control signal according to the phase error digital code of the local oscillator frequency generator.

The local oscillator frequency generator 210 is connected to the bit error matrix corrector 25; and the local oscillator frequency generator 210 receives the correction control signal sent by the bit error matrix corrector 25, and corrects the local oscillator signal phase digital code according to the correction control signal.

The up-conversion frequency mixer 29 is connected to the gain-controlled amplifier in the front-end frequency conversion module 22.

It should be noted that, in the transmitter shown in FIG. 2c, a buffer 1 and a buffer 2 in FIG. 2c are configured to buffer the signal amplitude digital code and phase digital code output by the amplitude code generator 24 and the phase code generator 27, and synchronize and refresh the buffered signal amplitude digital code and phase digital code; it should be noted that a specific implementation manner of synchronizing and refreshing buffered data (for example, the signal amplitude digital code and phase digital code in this embodiment) by the buffer may be any manner that is well known to a person skilled in the art.

Analysis on Beneficial Effects of this Embodiment:

In this embodiment of the present invention, components such as a bit error matrix corrector, an amplitude discriminator, a phase detector, an amplitude code generator, and a phase code generator are added to a front end of a radio frequency circuit of a receiver, so that the receiver/a transmitter may compare, by using the bit error matrix corrector, a signal amplitude digital code, a signal phase digital code, and a frequency generator phase digital code in the radio frequency circuit with a standard code source prestored in the bit error matrix corrector, and correct the signal amplitude digital code, the signal phase digital code, and the frequency generator phase digital code in the radio frequency circuit, thereby performing carrier recovery or carrier generation in the radio frequency circuit.

Compared with the prior art, a baseband chip no longer needs to perform carrier recovery or carrier generation, especially, does not need to assume functions such as frequency deviation suppression and phase noise suppression related to the carrier recovery and consume computing resources, thereby simplifying functions of the baseband chip, reducing power consumption of the baseband chip; moreover, because the baseband chip no longer needs to assume functions requiring execution of complex computing procedures, such as carrier recovery or carrier generation, technique complexity and design difficulty for fabricating the baseband chip are reduced, which directly reduces a cost for fabricating the baseband chip, thereby further reducing a running/use cost of the baseband chip.

Embodiment 2

A transmitter according to this embodiment includes a down-conversion frequency mixer, an amplitude discriminator, an amplitude code generator, a bit error matrix corrector, a local oscillator frequency generator, a phase detector, a phase code generator, a power splitter, a modulator, a gain-controlled amplifier, an up-conversion frequency mixer, a power amplifier, and a transmitting antenna.

The down-conversion frequency mixer is connected to the local oscillator frequency generator, and is configured to convert a to-be-sent radio frequency signal that is obtained from the local oscillator frequency generator into an intermediate-frequency analog signal, and then send the intermediate-frequency analog signal to the amplitude discriminator.

The amplitude discriminator is connected to the down-conversion frequency mixer, and is configured to generate a first signal amplitude pulse signal according to the intermediate-frequency analog signal sent by the down-conversion frequency mixer, and then send the first signal amplitude pulse signal to the amplitude code generator.

The amplitude code generator is connected to the amplitude discriminator, and is configured to convert the first signal amplitude pulse signal as a pulse signal into a first signal amplitude digital code as a digital signal, and then send the first signal amplitude digital code to the bit error matrix corrector, where the amplitude code generator is an encoder configured to convert a pulse signal into a digital signal.

The bit error matrix corrector is connected to the amplitude discriminator and the amplitude code generator, and is configured to generate an amplitude correction control signal according to the first signal amplitude digital code, and then send the amplitude correction control signal to the amplitude discriminator.

The amplitude discriminator is further configured to correct the first signal amplitude pulse signal according to the amplitude correction control signal, so as to generate a second signal amplitude pulse signal.

The amplitude code generator is further configured to convert the second signal amplitude pulse signal into a second signal amplitude digital code, so that the transmitter uses the second signal amplitude digital code as a signal amplitude digital code after carrier recovery or carrier generation.

Further, the phase detector is connected to the down-conversion frequency mixer, and is configured to generate a first signal phase pulse signal according to the intermediate-frequency analog signal sent by the down-conversion frequency mixer, and then send the first signal phase pulse signal to the phase code generator.

The phase code generator is connected to the phase detector, and is configured to convert the first signal phase pulse signal as a pulse signal into a first signal phase digital code as a digital signal, and then send the first signal phase digital code to the bit error matrix corrector, where the phase code generator is an encoder configured to convert a pulse signal into a digital signal.

The bit error matrix corrector is connected to the phase detector and the phase code generator, and is further configured to generate a phase correction control signal according to the first signal phase digital code, and then send the phase correction control signal to the phase detector.

The phase detector is configured to correct the first signal phase pulse signal according to the phase correction control signal, so as to generate a second signal phase pulse signal.

The phase code generator is further configured to convert the second signal phase pulse signal into a second signal phase digital code, so that the transmitter uses the second signal phase digital code as a signal phase digital code after carrier recovery or carrier generation.

The power splitter is connected to the down-conversion frequency mixer, the amplitude discriminator, and the phase detector, and is configured to receive the intermediate-frequency analog signal sent by the front-end frequency conversion module, split the intermediate-frequency analog signal into two identical intermediate-frequency analog signals, and then send the two identical intermediate-frequency analog signals respectively to the amplitude discriminator and the phase detector, so that the amplitude discriminator generates the first signal amplitude pulse signal according to one of the intermediate-frequency analog signals sent by the power splitter, and the phase detector generates the first signal phase pulse signal according to the other one of the intermediate-frequency analog signals sent by the power splitter.

The modulator is connected to the phase code generator and the amplitude code generator, and is configured to generate another intermediate-frequency analog signal according to the second signal phase digital code and the second signal amplitude digital code.

The up-conversion frequency mixer is connected to the local oscillator frequency generator and the modulator, and is configured to regenerate a radio frequency signal according to the intermediate-frequency analog signal generated by the modulator and the radio frequency signal output by the local oscillator frequency generator, and send the regenerated radio frequency signal to the power amplifier.

The transmitting antenna is connected to the power amplifier, and is configured to transmit the regenerated radio frequency signal that has been processed by the power amplifier, where the power amplifier is connected to the up-conversion frequency mixer.

Figure 3A:
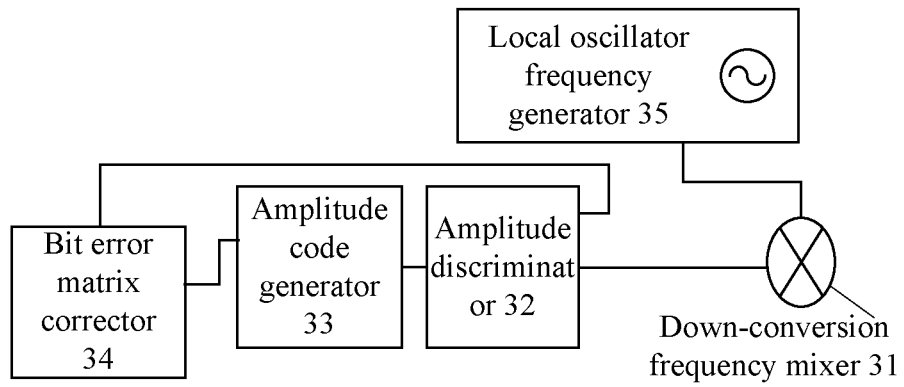
FIG. 3a is a schematic structural diagram of a transmitter according to Embodiment 2 of the present invention.

Specifically, in this embodiment, as shown in FIG. 3a, a transmitter may include a down-conversion frequency mixer 31, an amplitude discriminator 32, an amplitude code generator 33, a bit error matrix corrector 34, and a local oscillator frequency generator 35.

The down-conversion frequency mixer 31 is connected to the local oscillator frequency generator 35, and converts a to-be-sent radio frequency signal that is obtained from the local oscillator frequency generator 35 into an intermediate-frequency analog signal, and then sends the intermediate-frequency analog signal to the amplitude discriminator 32.

The amplitude discriminator 32 is connected to the down-conversion frequency mixer 31; and the amplitude discriminator 32 generates a first signal amplitude pulse signal according to the intermediate-frequency analog signal sent by the down-conversion frequency mixer 31, and then sends the first signal amplitude pulse signal to the amplitude code generator 33.

The amplitude code generator 33 is connected to the amplitude discriminator 32; and the amplitude code generator 33 converts the first signal amplitude pulse signal into a first signal amplitude digital code, and then sends the first signal amplitude digital code to the bit error matrix corrector 34.

The bit error matrix corrector 34 is connected to the amplitude discriminator 32; the bit error matrix corrector 34 generates an amplitude correction control signal according to the first signal amplitude digital code, and then sends the amplitude correction control signal to the amplitude discriminator 32.

The amplitude discriminator 32 corrects the first signal amplitude pulse signal according to the amplitude correction control signal, so as to generate a second signal amplitude pulse signal.

The amplitude code generator 33 converts the second signal amplitude pulse signal into a second signal amplitude digital code, so that the transmitter uses the second signal amplitude digital code as a signal amplitude digital code after carrier recovery or carrier generation.

Figure 3B:
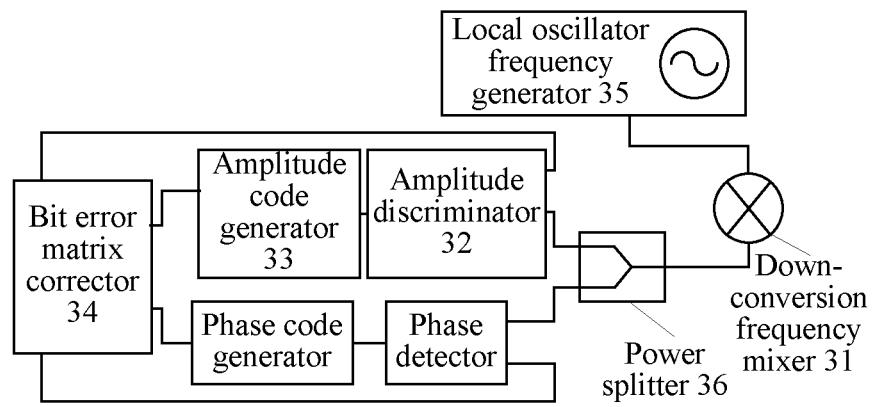
FIG. 3b is another schematic structural diagram of a transmitter according to Embodiment 2 of the present invention.

Further, the transmitter according to this embodiment may, as shown in FIG. 3b, further include a power splitter 36, a phase detector 37, and a phase code generator 38.

The phase detector 37 is connected to the down-conversion frequency mixer 31; and the phase detector 37 generates the first signal phase pulse signal according to the intermediate-frequency analog signal sent by the down-conversion frequency mixer 31, and then sends the first signal phase pulse signal to the phase code generator 38.

The phase code generator 38 is connected to the phase detector 37; and the phase code generator 38 converts the first signal phase pulse signal into the first signal phase digital code, and then sends the first signal phase digital code to the bit error matrix corrector 34.

The bit error matrix corrector 34 is connected to the phase detector 37; and the bit error matrix corrector 34 generates the phase correction control signal according to the first signal phase digital code, and then sends the phase correction control signal to the phase detector 37.

The phase detector 37 corrects the first signal phase pulse signal according to the phase correction control signal, so as to generate a second signal phase pulse signal.

The phase code generator 38 converts the second signal phase pulse signal into the second signal phase digital code, so that the transmitter uses the second signal phase digital code as a signal phase digital code after carrier recovery or carrier generation.

The power splitter 36 is connected to the down-conversion frequency mixer 31, the amplitude discriminator 32, and the phase detector 37; and the power splitter 36 receives the intermediate-frequency analog signal sent by the front-end frequency conversion module, splits the intermediate-frequency analog signal into two identical intermediate-frequency analog signals, and then sends the two identical intermediate-frequency analog signals respectively to the amplitude discriminator 32 and the phase detector 37, so that the amplitude discriminator 32 generates the first signal amplitude pulse signal according to one of the intermediate-frequency analog signals, and the phase detector 37 generates the first signal phase pulse signal according to the other one of the intermediate-frequency analog signals.

Figure 3C:
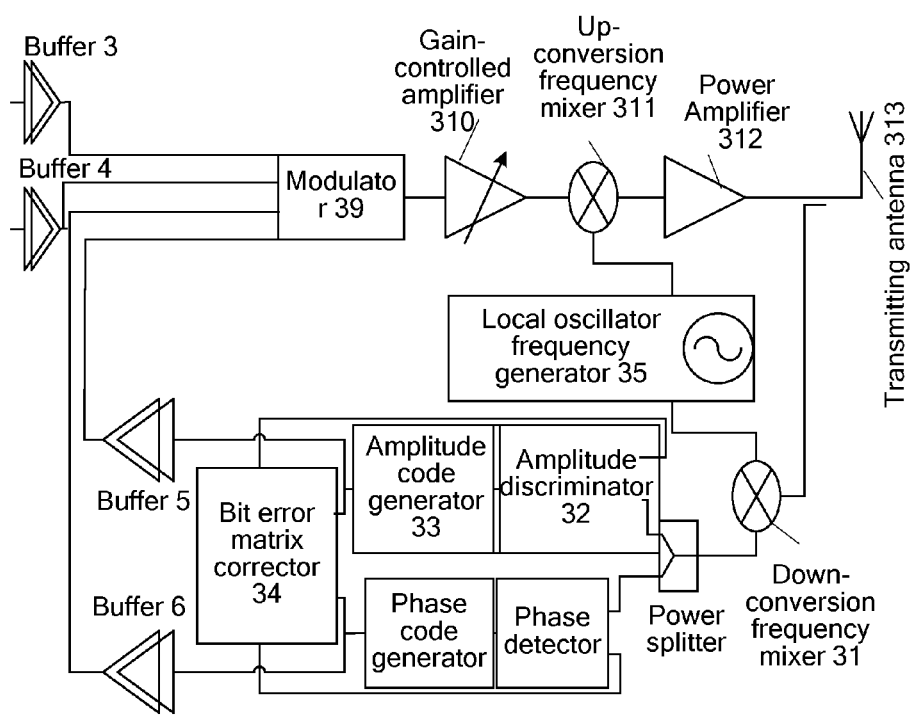
FIG. 3c is still another schematic structural diagram of a transmitter according to Embodiment 2 of the present invention.

Still further, the transmitter according to this embodiment may, as shown in FIG. 3c, further include a modulator 39, a gain-controlled amplifier 310, an up-conversion frequency mixer 311, a power amplifier 312, and a transmitting antenna 313.

The modulator 30 is connected to the phase code generator 38 and the amplitude code generator 33; and the modulator 30 generates another intermediate-frequency analog signal according to the second signal phase digital code and the second signal amplitude digital code.

The up-conversion frequency mixer 311 is connected to the local oscillator frequency generator 35 and the modulator 39; and the up-conversion frequency mixer 311 regenerates a radio frequency signal according to the intermediate-frequency analog signal generated by the modulator 39 and the radio frequency signal output by the local oscillator frequency generator 35, and sends the regenerated radio frequency signal to the power amplifier 312.

The transmitting antenna 313 is connected to the power amplifier 312; the power amplifier 312 is connected to the up-conversion frequency mixer 311; and the transmitting antenna 313 transmits the regenerated radio frequency signal that has been processed by the power amplifier 312.

It should be noted that, functions and execution manners of a buffer 5 and a buffer 6 in FIG. 3c are the same as those of the buffer 1 and the buffer 2 in FIG. 2c, both are synchronizing and refreshing a buffered signal amplitude digital code and phase digital code.

It should be further noted that a buffer 3 and a buffer 4 are further included in FIG. 3c, and may receive and buffer a signal sent by the baseband chip, and transfer the buffered signal to the modulator 39. The signal transmission means and signal processing manner of the baseband chip→the buffer 3/buffer 4→the modulator 39 may be a manner that is well known to a person skilled in the art.

An existing technical means is used.

Analysis on Beneficial Effects of this Embodiment:

In this embodiment of the present invention, components such as a bit error matrix corrector, an amplitude discriminator, a phase detector, an amplitude code generator, and a phase code generator are added to a front end of a radio frequency circuit of a transmitter, so that a receiver/the transmitter may compare, by using the bit error matrix corrector, a signal amplitude digital code, a signal phase digital code, and a frequency generator phase digital code in the radio frequency circuit with a standard code source prestored in the bit error matrix corrector, and correct the signal amplitude digital code, the signal phase digital code, and the frequency generator phase digital code in the radio frequency circuit, thereby performing carrier recovery or carrier generation in the radio frequency circuit.

Compared with the prior art, a baseband chip no longer needs to perform carrier recovery or carrier generation, especially, does not need to assume functions such as frequency deviation suppression and phase noise suppression related to the carrier recovery and consume computing resources, thereby simplifying functions of the baseband chip, reducing power consumption of the baseband chip; moreover, because the baseband chip no longer needs to assume functions requiring execution of complex computing procedures, such as carrier recovery or carrier generation, technique complexity and design difficulty for fabricating the baseband chip are reduced, which directly reduces a cost for fabricating the baseband chip, thereby further reducing a running/use cost of the baseband chip.

Embodiment 3

Figure 4A:
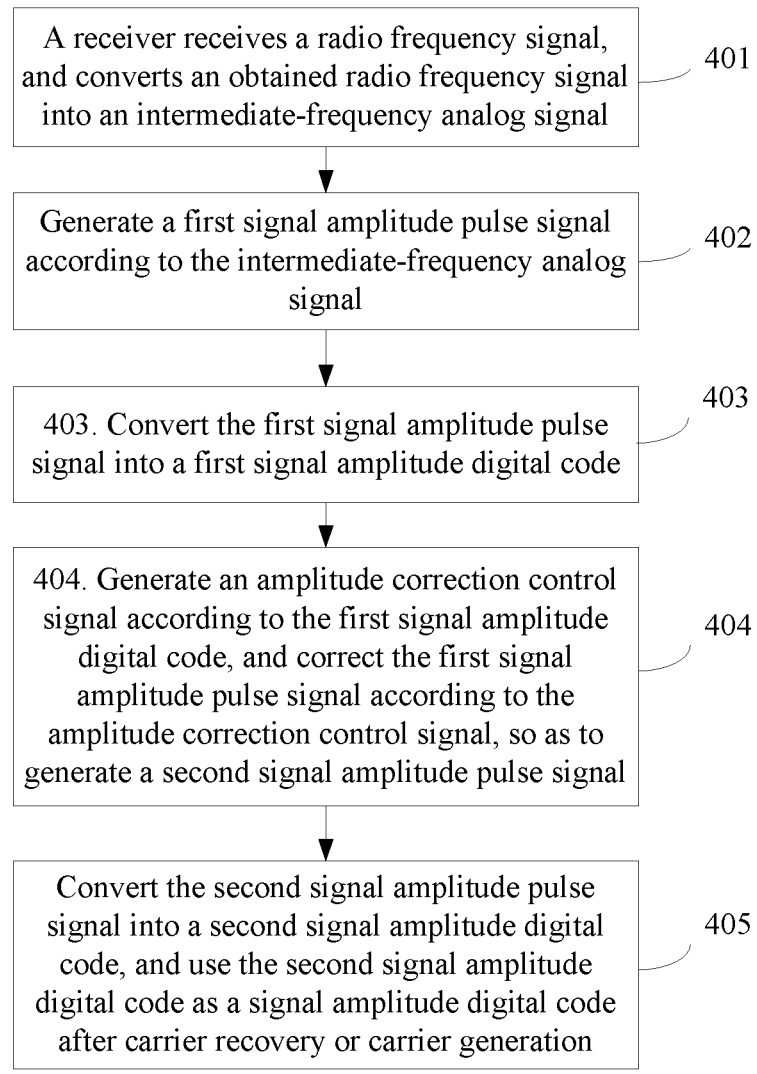
FIG. 4a is a flowchart of a method for receiving a radio frequency signal according to Embodiment 3 of the present invention.

This embodiment of the present invention provides a method for receiving a radio frequency signal, which is performed by a receiver. As shown in FIG. 4a, the method includes:

401. A receiver receives a radio frequency signal, and converts an obtained radio frequency signal into an intermediate-frequency analog signal.

402. Generate a first signal amplitude pulse signal according to the intermediate-frequency analog signal.

403. Convert the first signal amplitude pulse signal into a first signal amplitude digital code.

404. Generate an amplitude correction control signal according to the first signal amplitude digital code, and correct the first signal amplitude pulse signal according to the amplitude correction control signal, so as to generate a second signal amplitude pulse signal.

405. Convert the second signal amplitude pulse signal into a second signal amplitude digital code, and use the second signal amplitude digital code as a signal amplitude digital code after carrier recovery or carrier generation.

Figure 4B:
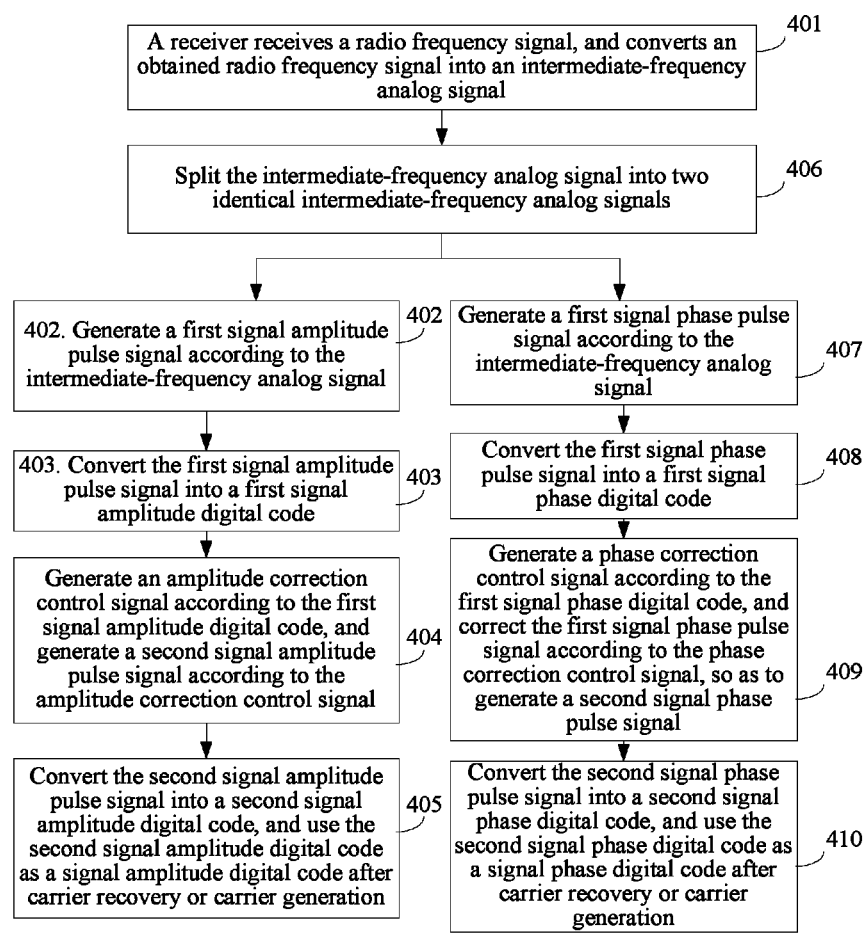
FIG. 4b is another flowchart of a method for receiving a radio frequency signal according to Embodiment 3 of the present invention.

In a parallel manner, as shown in FIG. 4b, the method for receiving a radio frequency signal provided by this embodiment may further include:

406. The receiver splits the intermediate-frequency analog signal into two identical intermediate-frequency analog signals.

407. Generate a first signal phase pulse signal according to the intermediate-frequency analog signal.

408. Convert the first signal phase pulse signal into a first signal phase digital code.

409. Generate a phase correction control signal according to the first signal phase digital code, and correct the first signal phase pulse signal according to the phase correction control signal, so as to generate a second signal phase pulse signal.

410. Convert the second signal phase pulse signal into a second signal phase digital code, and use the second signal phase digital code as a signal phase digital code after carrier recovery or carrier generation.

Figure 4C:
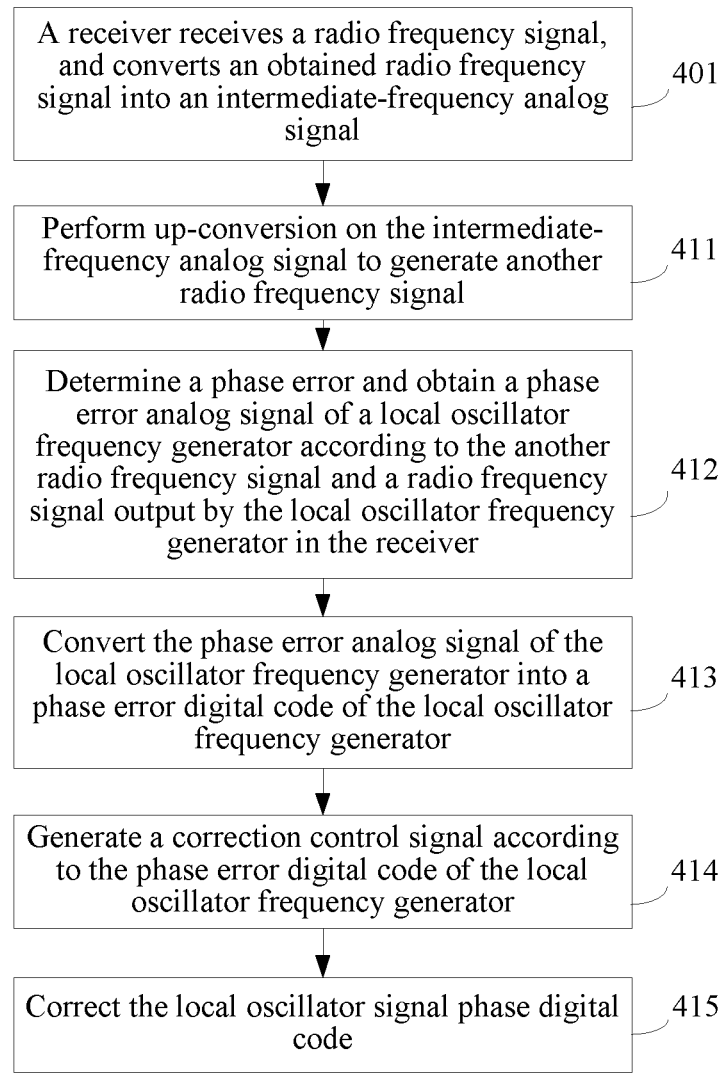
FIG. 4c is still another flowchart of a method for receiving a radio frequency signal according to Embodiment 3 of the present invention.

Further, as shown in FIG. 4c, the method for receiving a radio frequency signal provided by this embodiment further includes:

411. The receiver performs up-conversion on the intermediate-frequency analog signal to generate another radio frequency signal.

412. Determine a phase error and obtain a phase error analog signal of a local oscillator frequency generator according to the another radio frequency signal and a radio frequency signal output by the local oscillator frequency generator in the receiver.

413. Convert the phase error analog signal of the local oscillator frequency generator into a phase error digital code of the local oscillator frequency generator.

414. Generate a correction control signal according to the phase error digital code of the local oscillator frequency generator.

415. Correct the local oscillator signal phase digital code according to the correction control signal.

In this embodiment, a function of carrier recovery or carrier generation can be implemented on a radio frequency circuit portion of a receiver; compared with the prior art, a baseband chip no longer needs to perform carrier recovery or carrier generation, especially, does not need to assume functions such as frequency deviation suppression and phase noise suppression related to the carrier recovery and consume computing resources, thereby simplifying functions of the baseband chip, reducing power consumption of the baseband chip; moreover, because the baseband chip no longer needs to assume functions requiring execution of complex computing procedures, such as carrier recovery or carrier generation, technique complexity and design difficulty for fabricating the baseband chip are reduced, which directly reduces a cost for fabricating the baseband chip, thereby further reducing a running/use cost of the baseband chip.

Embodiment 4

Figure 5A:
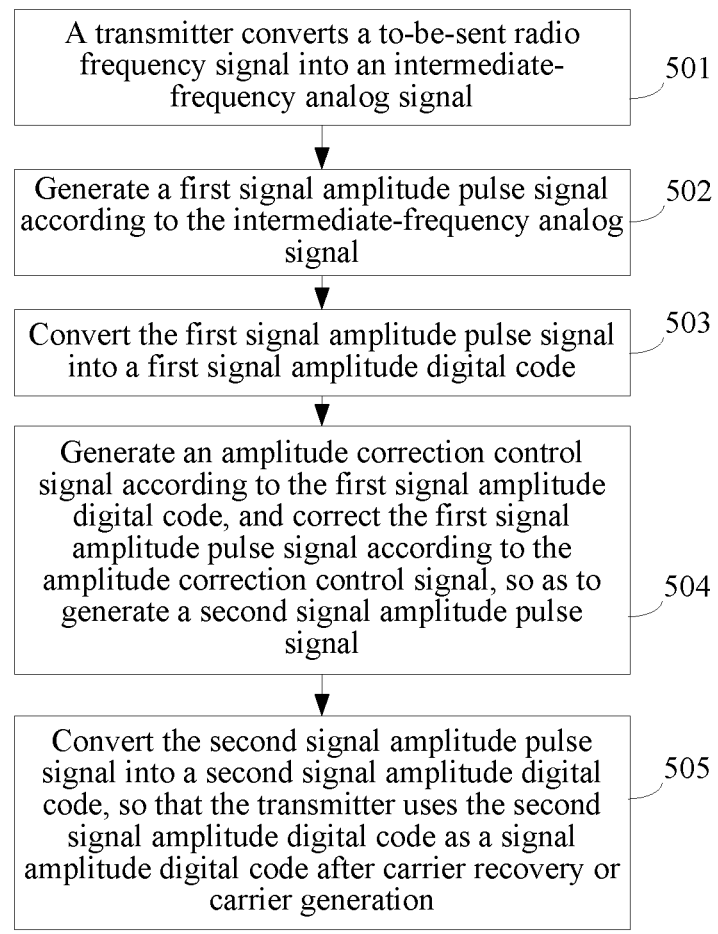
FIG. 5a is a flowchart of a method for transmitting a radio frequency signal according to Embodiment 4 of the present invention.

This embodiment of the present invention provides a method for transmitting a radio frequency signal, which is performed by a transmitter. As shown in FIG. 5a, the method includes:

501. A transmitter converts a to-be-sent radio frequency signal into an intermediate-frequency analog signal.

502. Generate a first signal amplitude pulse signal according to the intermediate-frequency analog signal.

503. Convert the first signal amplitude pulse signal into a first signal amplitude digital code.

504. Generate an amplitude correction control signal according to the first signal amplitude digital code, and correct the first signal amplitude pulse signal according to the amplitude correction control signal, so as to generate a second signal amplitude pulse signal.

505. Convert the second signal amplitude pulse signal into a second signal amplitude digital code, so that the transmitter uses the second signal amplitude digital code as a signal amplitude digital code after carrier recovery or carrier generation.

Figure 5B:
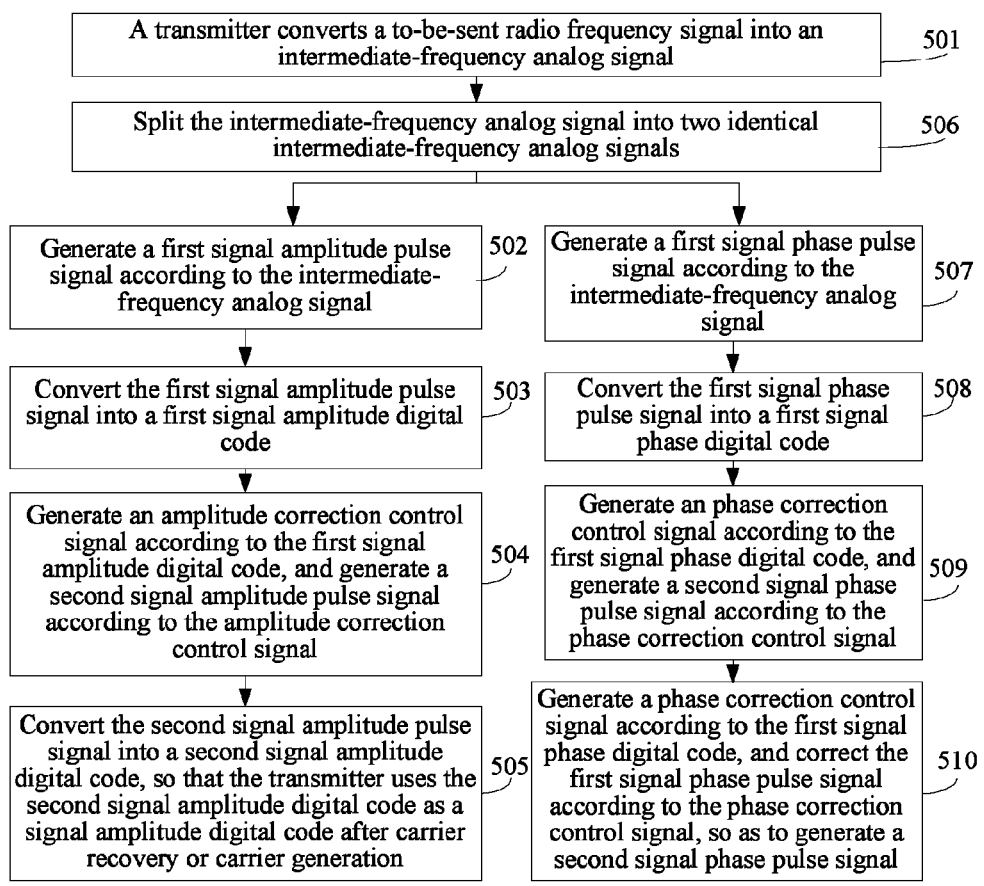
FIG. 5b is another flowchart of a method for transmitting a radio frequency signal according to Embodiment 4 of the present invention.

In a parallel manner, as shown in FIG. 5b, the method for transmitting a radio frequency signal provided by this embodiment, after the converting a to-be-sent radio frequency signal into an intermediate-frequency analog signal, further includes:

506. The transmitter splits the intermediate-frequency analog signal into two identical intermediate-frequency analog signals.

507. Generate a first signal phase pulse signal according to the intermediate-frequency analog signal.

508. Convert the first signal phase pulse signal into a first signal phase digital code.

509. Generate a phase correction control signal according to the first signal phase digital code, and correct the first signal phase pulse signal according to the phase correction control signal, so as to generate a second signal phase pulse signal.

510. Convert the second signal phase pulse signal into a second signal phase digital code.

Figure 5C:
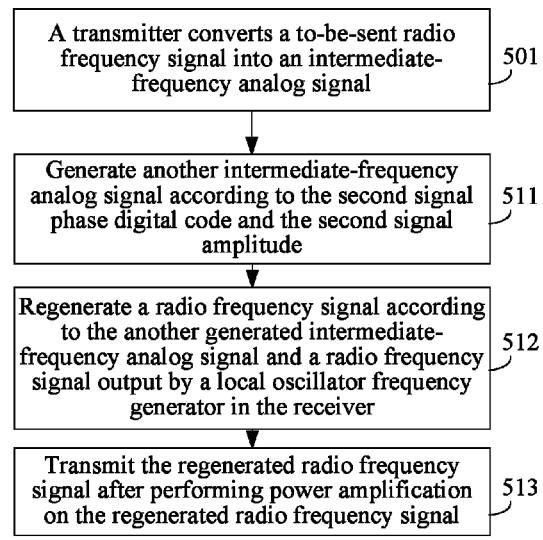
FIG. 5c is still another flowchart of a method for transmitting a radio frequency signal according to Embodiment 4 of the present invention.

Further, as shown in FIG. 5c, the method for transmitting a radio frequency signal provided by this embodiment further includes:

511. The transmitter generates another intermediate-frequency analog signal according to the second signal phase digital code and the second signal amplitude digital code.

512. Regenerate a radio frequency signal according to the another generated intermediate-frequency analog signal and a radio frequency signal output by a local oscillator frequency generator in the transmitter.

513. Transmit the regenerated radio frequency signal after performing power amplification on the regenerated radio frequency signal.

In this embodiment, a function of carrier recovery or carrier generation can be implemented on a radio frequency circuit portion of a transmitter; compared with the prior art, a baseband chip no longer needs to perform carrier recovery or carrier generation, especially, does not need to assume functions such as frequency deviation suppression and phase noise suppression related to the carrier recovery and consume computing resources, thereby simplifying functions of the baseband chip, reducing power consumption of the baseband chip; moreover, because the baseband chip no longer needs to assume functions requiring execution of complex computing procedures, such as carrier recovery or carrier generation, technique complexity and design difficulty for fabricating the baseband chip are reduced, which directly reduces a cost for fabricating the baseband chip, thereby further reducing a running/use cost of the baseband chip.

Embodiment 5

Figure 6A:
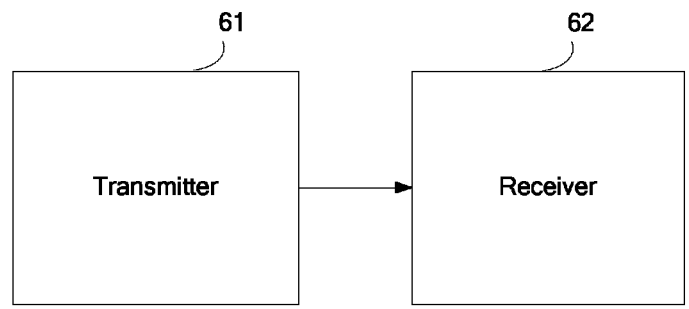
FIG. 6a is a schematic structural diagram of a system for receiving and transmitting a radio frequency signal according to Embodiment 5 of the present invention.

This embodiment of the present invention provides a system for receiving and transmitting a radio frequency signal, which, as shown in FIG. 6a, includes:

a receiver 61 and a transmitter 62.

The system for receiving and transmitting a radio frequency signal according to this embodiment includes the receiver according to Embodiment 1 and the transmitter according to Embodiment 2.

In this embodiment, the receiver 61 and the transmitter 62 may receive and transmit radio frequency signal by using a radio network, where a specific implementation manner may be any manner that is well known to a person skilled in the art.

Figure 6B:
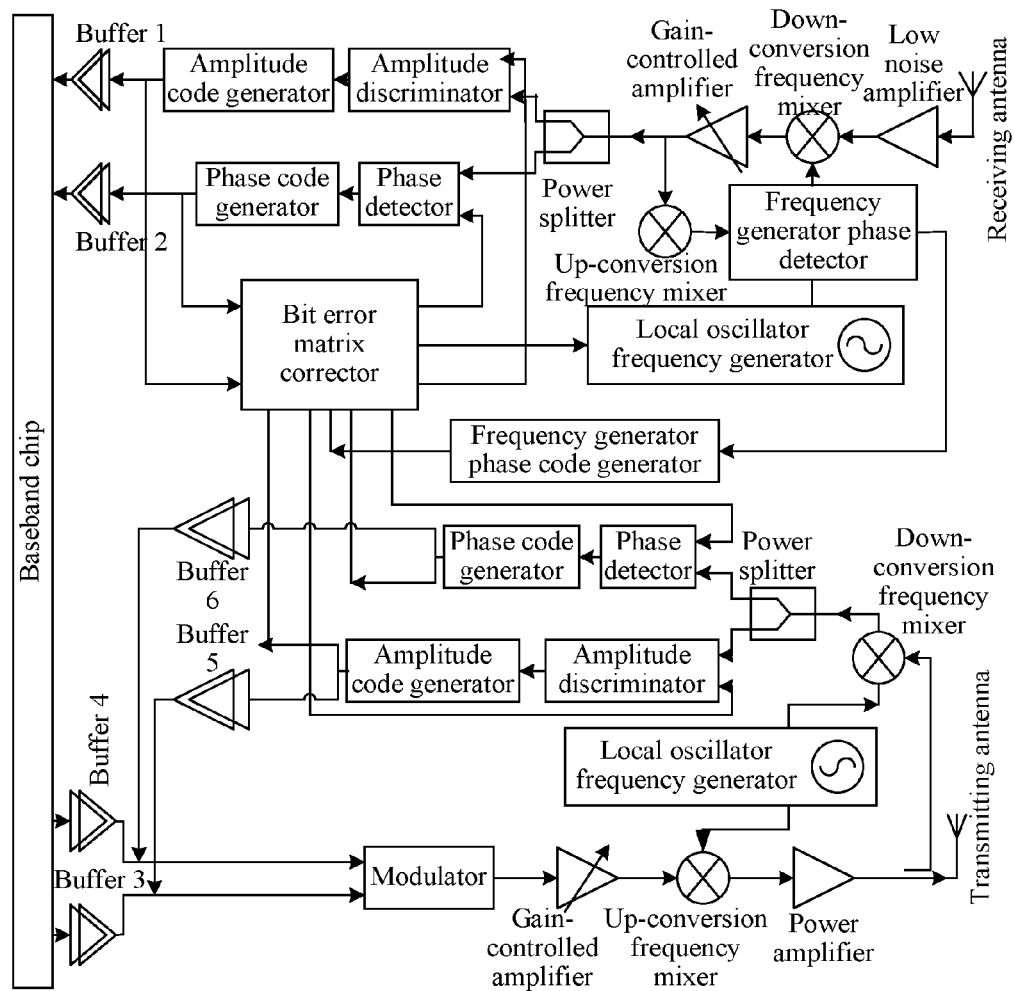
FIG. 6b is a schematic structural diagram of a specific example of a radio frequency circuit according to the present invention.

It should be noted that one end of the system for receiving and transmitting a radio frequency signal according to this embodiment may have functions of both the receiver and the transmitter; that is, the receiver according to Embodiment 1 and the transmitter according to Embodiment 2 are integrated into a same radio frequency circuit; moreover, a person skilled in the art may, by using a common technical means, enable a bit error matrix corrector to assume functions of both the transmitter and the receiver, so that the one radio frequency circuit has functions of both the receiver according to Embodiment 1 and the transmitter according to Embodiment 2, for example, as shown in FIG. 6b:

Radio frequency circuits of the transmitter and the receiver are integrated together, and share one bit error matrix corrector; moreover, a specific manner of performing carrier recovery or carrier generation by the radio frequency circuit that is shown in FIG. 6b and connected to a baseband chip may be the same as that in the foregoing embodiments.

Figure 6C:
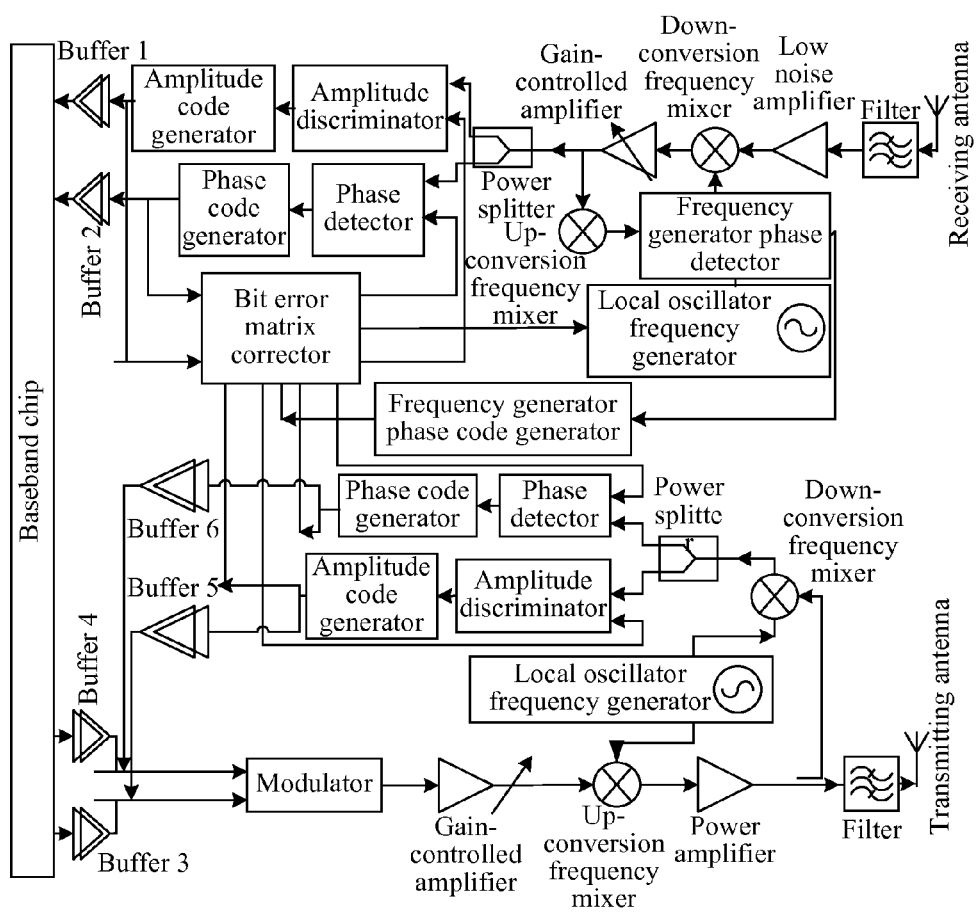
FIG. 6c is a schematic structural diagram of a specific example of another radio frequency circuit according to the present invention.

Further, as shown in FIG. 6c, the radio frequency circuit shown in FIG. 6b further includes two filters, where the two filters separately perform interference cancellation on a signal that passes through a receiving antenna or a transmitting antenna; in this embodiment, a specific implementation manner of performing interference cancellation by using a filter may be a manner that is well known to a person skilled in the art.

Figure 6D:
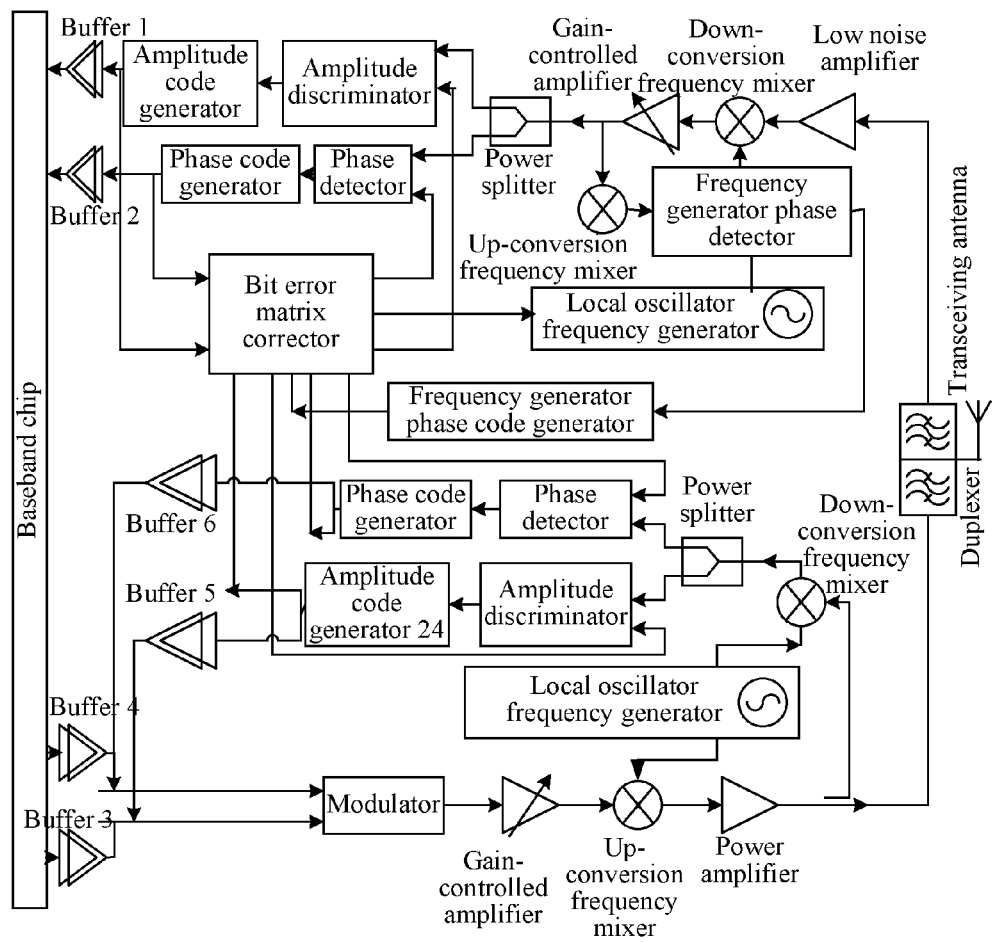
FIG. 6d is a schematic structural diagram of a specific example of still another radio frequency circuit according to the present invention.

Still further, as shown in FIG. 6d, the radio frequency circuit shown in FIG. 6b further includes one duplexer, where the duplexer performs interference cancellation on a signal that passes through a transceiving antenna; in this embodiment, a specific implementation manner of performing interference cancellation by using a duplexer may be a manner that is well known to a person skilled in the art.

In this embodiment, a function of carrier recovery or carrier generation can be implemented on a radio frequency circuit portion of a transmitter/receiver in a system for receiving and transmitting a radio frequency signal; compared with the prior art, a baseband chip of the system for receiving and transmitting a radio frequency signal no longer needs to perform carrier recovery or carrier generation, especially, does not need to assume functions such as frequency deviation suppression and phase noise suppression related to the carrier recovery and consume computing resources, thereby simplifying functions of the baseband chip, reducing power consumption of the baseband chip, and reducing running power consumption of the transmitter/receiver, which reduces power consumption of the system for receiving and transmitting a radio frequency signal that includes the transmitter/receiver, saves electrical energy, thereby reducing a running cost of the entire system.

A person of ordinary skill in the art may understand that all or a part of the processes of the methods in the embodiments may be implemented by a computer program instructing relevant hardware. The program may be stored in a computer readable storage medium. When the program runs, the processes of the methods in the embodiments are performed. The foregoing storage medium may include: a magnetic disk, an optical disc, a read-only memory (Read-Only Memory, ROM), a random access memory (Random Access Memory, RAM), or the like.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A receiver, comprising a receiving antenna, a front-end frequency conversion module, an amplitude discriminator, an amplitude code generator, and a bit error matrix corrector, wherein the front-end frequency conversion module is configured to obtain a radio frequency signal from the receiving antenna, convert the obtained radio frequency signal into an intermediate-frequency analog signal, and then send the intermediate-frequency analog signal to the amplitude discriminator, wherein the front-end frequency conversion module comprises a low noise amplifier, a down-conversion frequency mixer, and a gain-controlled amplifier;

the amplitude discriminator is connected to the front-end frequency conversion module, and is configured to generate a first signal amplitude pulse signal according to the intermediate-frequency analog signal sent by the front-end frequency conversion module, and then send the first signal amplitude pulse signal to the amplitude code generator;

the amplitude code generator is connected to the amplitude discriminator, and is configured to convert the first signal amplitude pulse signal as a pulse signal into a first signal amplitude digital code as a digital signal, and then send the first signal amplitude digital code to the bit error matrix corrector, wherein the amplitude code generator is an encoder configured to convert a pulse signal into a digital signal;

the bit error matrix corrector is connected to the amplitude discriminator and the amplitude code generator, and is configured to generate an amplitude correction control signal according to the first signal amplitude digital code, and then send the amplitude correction control signal to the amplitude discriminator;

the amplitude discriminator is configured to correct the first signal amplitude pulse signal according to the amplitude correction control signal, so as to generate a second signal amplitude pulse signal; and the amplitude code generator is further configured to convert the second signal amplitude pulse signal into a second signal amplitude digital code, so that the receiver uses the second signal amplitude digital code as a signal amplitude digital code after carrier recovery or carrier generation.

2. The receiver according to claim 1, further comprising a phase detector and a phase code generator, wherein
the phase detector is connected to the front-end frequency conversion module, and is configured to generate a first signal phase pulse signal according to the intermediate-frequency analog signal sent by the front-end frequency conversion module, and then send the first signal phase pulse signal to the phase code generator;
the phase code generator is connected to the phase detector, and is configured to convert the first signal phase pulse signal as a pulse signal into a first signal phase digital code as a digital signal, and then send the first signal phase digital code to the bit error matrix corrector, wherein the phase code generator is an encoder configured to convert a pulse signal into a digital signal;
the bit error matrix corrector is connected to the phase detector and the phase code generator, and is configured to generate a phase correction control signal according to the first signal phase digital code, and then send the phase correction control signal to the phase detector;
the phase detector is configured to correct the first signal phase pulse signal according to the phase correction control signal, so as to generate a second signal phase pulse signal; and
the phase code generator is further configured to convert the second signal phase pulse signal into a second signal phase digital code, so that the receiver uses the second signal phase digital code as a signal phase digital code after carrier recovery or carrier generation.

3. The receiver according to claim 1, further comprising a power splitter, wherein
the power splitter is connected to the front-end frequency conversion module, the amplitude discriminator, and the phase detector, and is configured to receive the intermediate-frequency analog signal sent by the front-end frequency conversion module, split the intermediate-frequency analog signal into two identical intermediate-frequency analog signals, and then send the two identical intermediate-frequency analog signals respectively to the amplitude discriminator and the phase detector, so that the amplitude discriminator generates the first signal amplitude pulse signal according to one of the intermediate-frequency analog signals sent by the power splitter, and the phase detector generates the first signal phase pulse signal according to the other one of the intermediate-frequency analog signals sent by the power splitter.

4. The receiver according to claim 1, further comprising an up-conversion frequency mixer, a frequency generator phase detector, a local oscillator frequency generator, and a frequency generator phase code generator, wherein
the up-conversion frequency mixer is connected to the front-end frequency conversion module, and is configured to perform up-conversion on the intermediate-frequency analog signal sent by the front-end frequency conversion module, so as to generate another radio frequency signal;
the frequency generator phase detector is connected to the local oscillator frequency generator and the up-conversion frequency mixer, and is configured to determine a phase error and obtain a phase error analog signal of the local oscillator frequency generator according to the radio frequency signal generated by the up-conversion frequency mixer and a radio frequency signal output by the local oscillator frequency generator;
the frequency generator phase code generator is connected to the frequency generator phase detector, and is configured to receive the phase error analog signal of the local oscillator frequency generator, and convert the phase error analog signal of the local oscillator frequency generator into a phase error digital code of the local oscillator frequency generator;
the bit error matrix corrector is connected to the frequency generator phase code generator, and is configured to receive the phase error digital code of the local oscillator frequency generator, and generate a correction control signal according to the phase error digital code of the local oscillator frequency generator; and
the local oscillator frequency generator is connected to the bit error matrix corrector, and is configured to receive the correction control signal sent by the bit error matrix corrector, and correct a local oscillator signal phase digital code according to the correction control signal.

5. The receiver according to claim 1, wherein the up-conversion frequency mixer is connected to the gain-controlled amplifier in the front-end frequency conversion module, and the down-conversion frequency mixer in the front-end frequency conversion module is connected to the frequency generator phase detector.

6. A transmitter, comprising a down-conversion frequency mixer, an amplitude discriminator, an amplitude code generator, a bit error matrix corrector, and a local oscillator frequency generator, wherein
the down-conversion frequency mixer is connected to the local oscillator frequency generator, and is configured to convert a to-be-sent radio frequency signal that is obtained from the local oscillator frequency generator into an intermediate-frequency analog signal, and then send the intermediate-frequency analog signal to the amplitude discriminator;
the amplitude discriminator is connected to the down-conversion frequency mixer, and is configured to generate a first signal amplitude pulse signal according to the intermediate-frequency analog signal sent by the down-conversion frequency mixer, and then send the first signal amplitude pulse signal to the amplitude code generator;
the amplitude code generator is connected to the amplitude discriminator, and is configured to convert the first signal amplitude pulse signal as a pulse signal into a first signal amplitude digital code as a digital signal, and then send the first signal amplitude digital code to the bit error matrix corrector, wherein the amplitude code generator is an encoder configured to convert a pulse signal into a digital signal;
the bit error matrix corrector is connected to the amplitude discriminator and the amplitude code generator, and is configured to generate an amplitude correction control signal according to the first signal amplitude digital code, and then send the amplitude correction control signal to the amplitude discriminator;
the amplitude discriminator is further configured to correct the first signal amplitude pulse signal according to the amplitude correction control signal, so as to generate a second signal amplitude pulse signal; and
the amplitude code generator is further configured to convert the second signal amplitude pulse signal into a second signal amplitude digital code, so that the transmitter uses the second signal amplitude digital code as a signal amplitude digital code after carrier recovery or carrier generation.

7. The transmitter according to claim 6, further comprising phase detector and a phase code generator, wherein
the phase detector is connected to the down-conversion frequency mixer, and is configured to generate a first signal phase pulse signal according to the intermediate-frequency analog signal sent by the down-conversion frequency mixer, and then send the first signal phase pulse signal to the phase code generator;
the phase code generator is connected to the phase detector, and is configured to convert the first signal phase pulse signal as a pulse signal into a first signal phase digital code as a digital signal, and then send the first signal phase digital code to the bit error matrix corrector, wherein the phase code generator is an encoder configured to convert a pulse signal into a digital signal;
the bit error matrix corrector is connected to the phase detector and the phase code generator, and is configured to generate a phase correction control signal according to the first signal phase digital code, and then send the phase correction control signal to the phase detector;
the phase detector is configured to correct the first signal phase pulse signal according to the phase correction control signal, so as to generate a second signal phase pulse signal; and
the phase code generator is further configured to convert the second signal phase pulse signal into a second signal phase digital code, so that the transmitter uses the second signal phase digital code as a signal phase digital code after carrier recovery or carrier generation.

8. The transmitter according to claim 6, further comprising a power splitter, wherein
the power splitter is connected to the down-conversion frequency mixer, the amplitude discriminator, and the phase detector, and is configured to receive the intermediate-frequency analog signal sent by the front-end frequency conversion module, split the intermediate-frequency analog signal into two identical intermediate-frequency analog signals, and then send the two identical intermediate-frequency analog signals respectively to the amplitude discriminator and the phase detector, so that the amplitude discriminator generates the first signal amplitude pulse signal according to one of the intermediate-frequency analog signals sent by the power splitter, and the phase detector generates the first signal phase pulse signal according to the other one of the intermediate-frequency analog signals sent by the power splitter.

9. The transmitter according to claim 7, further comprising a modulator, a gain-controlled amplifier, an up-conversion frequency mixer, a power amplifier, and a transmitting antenna, wherein
the modulator is connected to the phase code generator and the amplitude code generator, and is configured to generate another intermediate-frequency analog signal according to the second signal phase digital code and the second signal amplitude digital code;
the up-conversion frequency mixer is connected to the local oscillator frequency generator and the modulator, and is configured to regenerate a radio frequency signal according to the intermediate-frequency analog signal generated by the modulator and the radio frequency signal output by the local oscillator frequency generator, and send the regenerated radio frequency signal to the power amplifier; and
the transmitting antenna is connected to the power amplifier, and is configured to transmit the regenerated radio frequency signal that has been processed by the power amplifier, wherein the power amplifier is connected to the up-conversion frequency mixer.

10. A method for receiving a radio frequency signal, comprising:
receiving, by a receiver, the radio frequency signal, and converting an obtained radio frequency signal into an intermediate-frequency analog signal;
generating a first signal amplitude pulse signal according to the intermediate-frequency analog signal;
converting the first signal amplitude pulse signal into a first signal amplitude digital code;
comparing the first signal amplitude digital code with a standard code source of a signal amplitude digital code stored in a bit error matrix corrector to generate an amplitude correction control signal, and correcting the first signal amplitude pulse signal according to the amplitude correction control signal, so as to generate a second signal amplitude pulse signal; and
converting the second signal amplitude pulse signal into a second signal amplitude digital code, and using the second signal amplitude digital code as a signal amplitude digital code after carrier recovery or carrier generation.

11. The method for receiving the radio frequency signal according to claim 10, further comprising:
generating a first signal phase pulse signal according to the intermediate-frequency analog signal;
converting the first signal phase pulse signal into a first signal phase digital code;
comparing the first signal phase digital code with a standard code source of a signal phase digital code stored in the bit error matrix corrector to generate a phase correction control signal, and correcting the first signal phase pulse signal according to the phase correction control signal, so as to generate a second signal phase pulse signal; and
converting the second signal phase pulse signal into a second signal phase digital code, and using the second signal phase digital code as a signal phase digital code after carrier recovery or carrier generation.

12. The method for receiving the radio frequency signal according to claim 10, wherein after the converting the obtained radio frequency signal into the intermediate-frequency analog signal, the method further comprises:
splitting the intermediate-frequency analog signal into two identical intermediate-frequency analog signals, so that the receiver generates the first signal amplitude pulse signal according to one of the intermediate-frequency analog signals and generates the first signal phase pulse signal according to the other one of the intermediate-frequency analog signals.

13. The method for receiving the radio frequency signal according to claim 10, further comprising:
performing up-conversion on the intermediate-frequency analog signal to generate another radio frequency signal;
determining a phase error and obtaining a phase error analog signal of a local oscillator frequency generator according to the another radio frequency signal and a radio frequency signal output by the local oscillator frequency generator in the receiver;
converting the phase error analog signal of the local oscillator frequency generator into a phase error digital code of the local oscillator frequency generator;
comparing the phase error digital code of the local oscillator frequency generator with a standard code source in a local oscillator signal phase digital code stored in the bit error matrix corrector to generate a correction control signal; and correcting the local oscillator signal phase digital code according to the correction control signal.

14. A method for transmitting a radio frequency signal, comprising:

converting, by a transmitter, a to-be-sent radio frequency signal into an intermediate-frequency analog signal;

generating a first signal amplitude pulse signal according to the intermediate-frequency analog signal;

converting the first signal amplitude pulse signal into a first signal amplitude digital code;

generating an amplitude correction control signal according to the first signal amplitude digital code, and correcting the first signal amplitude pulse signal according to the amplitude correction control signal, so as to generate a second signal amplitude pulse signal; and converting the second signal amplitude pulse signal into a second signal amplitude digital code, so that the transmitter uses the second signal amplitude digital code as a signal amplitude digital code after carrier recovery or carrier generation.

15. The method for transmitting the radio frequency signal according to claim 14, further comprising:

generating a first signal phase pulse signal according to the intermediate-frequency analog signal;

converting the first signal phase pulse signal into a first signal phase digital code;

generating a phase correction control signal according to the first signal phase digital code, and correcting the first signal phase pulse signal according to the phase correction control signal, so as to generate a second signal phase pulse signal; and converting the second signal phase pulse signal into a second signal phase digital code, so that the transmitter uses the second signal phase digital code as a signal phase digital code after carrier recovery or carrier generation.

16. The method for transmitting the radio frequency signal according to claim 14, wherein after the converting the to-be-sent radio frequency signal into the intermediate-frequency analog signal, the method further comprises:

splitting the intermediate-frequency analog signal into two identical intermediate-frequency analog signals, so that the transmitter generates the first signal amplitude pulse signal according to one of the intermediate-frequency analog signals and generates the first signal phase pulse signal according to the other one of the intermediate-frequency analog signals.

17. The method for transmitting the radio frequency signal according to claim 14, further comprising:

generating another intermediate-frequency analog signal according to the second signal phase digital code and the second signal amplitude digital code;

regenerating a radio frequency signal according to the another generated intermediate-frequency analog signal and a radio frequency signal output by a local oscillator frequency generator in the transmitter; and transmitting the regenerated radio frequency signal after performing power amplification on the regenerated radio frequency signal.

* * * * *